United States Patent
Khalili et al.

(10) Patent No.: US 12,363,865 B2
(45) Date of Patent: Jul. 15, 2025

(54) REGENERATIVE PREHEATER FOR PHASE CHANGE COOLING APPLICATIONS

(71) Applicant: The Research Foundation for The State University of New York, Binghamton, NY (US)

(72) Inventors: Sadegh Khalili, Poughkeepsie, NY (US); Bahgat Sammakia, Binghamton, NY (US)

(73) Assignee: The Research Foundation for The State University of New York, Binghamton, NY (US)

(*) Notice: Subject to any disclaimer, the term of this patent is extended or adjusted under 35 U.S.C. 154(b) by 0 days.

(21) Appl. No.: 18/376,435

(22) Filed: Oct. 3, 2023

(65) Prior Publication Data

US 2024/0032250 A1 Jan. 25, 2024

Related U.S. Application Data

(63) Continuation-in-part of application No. 17/588,209, filed on Jan. 28, 2022, now abandoned.

(51) Int. Cl.
*H05K 7/20* (2006.01)
*F25B 23/00* (2006.01)

(52) U.S. Cl.
CPC ....... *H05K 7/20327* (2013.01); *F25B 23/006* (2013.01); *H05K 7/20309* (2013.01); *H05K 7/20818* (2013.01)

(58) Field of Classification Search
CPC ............ H05K 7/20327; H05K 7/2029; H05K 7/20663; H05K 7/20672; H05K 7/20809; F25B 23/00; F25B 23/006
See application file for complete search history.

(56) References Cited

U.S. PATENT DOCUMENTS

| | | |
|---|---|---|
| 4,138,692 A | 2/1979 | Meeker |
| 4,203,129 A | 5/1980 | Oktay |
| 4,233,645 A | 11/1980 | Balderes |
| 4,263,965 A | 4/1981 | Mansuria |
| 4,474,231 A | 10/1984 | Staub |
| 4,590,538 A | 5/1986 | Cray, Jr. |
| 4,704,658 A | 11/1987 | Yokouchi |
| 4,765,397 A | 8/1988 | Chrysler |
| 4,809,521 A * | 3/1989 | Mokadam ............... F25B 9/006 62/513 |
| 4,941,530 A | 7/1990 | Crowe |
| 4,944,344 A | 7/1990 | Crowe |
| 4,970,868 A | 11/1990 | Grebe |
| 4,987,478 A | 1/1991 | Braun |

(Continued)

FOREIGN PATENT DOCUMENTS

WO WO2021110052 6/2021

*Primary Examiner* — Christopher R Zerphey
(74) *Attorney, Agent, or Firm* — Hoffberg & Associates; Steven M. Hoffberg

(57) ABSTRACT

A method for cooling an information technology system, comprising: receiving a flow of at least a subcooled liquid phase change refrigerant; cooling the information technology system by sensible heat transfer in an evaporator, to produce at least gaseous refrigerant; and exchanging heat from the at least gaseous refrigerant from the evaporator to the subcooled liquid phase change refrigerant. The phase change refrigerant may be a hydrofluorocarbon ether having a boiling point of 30-65° C. at 1-12 bar.

20 Claims, 4 Drawing Sheets

(56) References Cited

U.S. PATENT DOCUMENTS

| | | | |
|---|---|---|---|
| 5,004,973 A | 4/1991 | Taraci | |
| 5,021,924 A | 6/1991 | Kieda | |
| 5,038,571 A | 8/1991 | Yokouchi | |
| 5,099,908 A | 3/1992 | Taraci | |
| 5,103,557 A | 4/1992 | Leedy | |
| 5,119,021 A | 6/1992 | Taraci | |
| 5,131,233 A | 7/1992 | Cray | |
| 5,168,348 A | 12/1992 | Chu | |
| 5,180,001 A | 1/1993 | Okada | |
| 5,225,771 A | 7/1993 | Leedy | |
| 5,243,837 A * | 9/1993 | Radermacher | F25B 5/04 62/113 |
| 5,271,455 A | 12/1993 | Semple | |
| 5,297,621 A | 3/1994 | Taraci | |
| 5,300,810 A | 4/1994 | Eden | |
| 5,349,499 A | 9/1994 | Yamada | |
| 5,451,489 A | 9/1995 | Leedy | |
| 5,463,872 A | 11/1995 | Vader | |
| 5,469,711 A | 11/1995 | McCoy | |
| 5,495,490 A | 2/1996 | Rice | |
| 5,544,696 A | 8/1996 | Leland | |
| 5,552,635 A | 9/1996 | Kim | |
| 5,585,772 A | 12/1996 | Joshi | |
| 5,600,257 A | 2/1997 | Leas | |
| 5,629,137 A | 5/1997 | Leedy | |
| 5,647,429 A | 7/1997 | Oktay | |
| 5,654,127 A | 8/1997 | Leedy | |
| 5,725,995 A | 3/1998 | Leedy | |
| 5,765,391 A * | 6/1998 | Lee | F25B 40/00 62/442 |
| 5,814,392 A | 9/1998 | You | |
| 5,907,473 A | 5/1999 | Przilas | |
| 5,920,457 A | 7/1999 | Lamb | |
| 5,929,651 A | 7/1999 | Leas | |
| 6,065,208 A | 5/2000 | Lamb | |
| 6,111,749 A | 8/2000 | Lamb | |
| 6,139,361 A | 10/2000 | Przilas | |
| 6,193,905 B1 | 2/2001 | Yamada | |
| 6,351,134 B2 | 2/2002 | Leas | |
| 6,404,640 B1 | 6/2002 | Ishimine | |
| 6,443,222 B1 | 9/2002 | Yun | |
| 6,499,308 B2 * | 12/2002 | Inoue | F25B 49/02 62/228.3 |
| 6,552,560 B2 | 4/2003 | Melgaard | |
| 6,595,014 B2 | 7/2003 | Malone | |
| 6,621,707 B2 | 9/2003 | Ishimine | |
| 6,700,458 B2 | 3/2004 | Mitrovic | |
| 6,724,792 B2 | 4/2004 | Rice | |
| 6,744,136 B2 | 6/2004 | Dubhashi | |
| 6,772,603 B2 | 8/2004 | Hsu | |
| 6,817,196 B2 | 11/2004 | Malone | |
| 6,882,156 B2 | 4/2005 | Hauptman | |
| 7,111,469 B2 * | 9/2006 | Horan | F25B 45/00 62/208 |
| 7,145,927 B2 | 12/2006 | Rice | |
| 7,285,851 B1 | 10/2007 | Cepeda-Rizo | |
| 7,375,542 B2 | 5/2008 | Teneketges | |
| 7,462,429 B2 | 12/2008 | Menchtchikov | |
| 7,462,430 B2 | 12/2008 | Menchtchikov | |
| 7,556,086 B2 | 7/2009 | Joshi | |
| 7,625,854 B2 | 12/2009 | Owens | |
| 7,629,307 B2 | 12/2009 | Owens | |
| 7,663,389 B2 | 2/2010 | Teneketges | |
| 7,710,538 B2 | 5/2010 | Menchtchikov | |
| 7,710,539 B2 | 5/2010 | Menchtchikov | |
| 7,724,524 B1 | 5/2010 | Campbell | |
| 7,760,497 B2 | 7/2010 | Eddy | |
| 7,767,635 B2 | 8/2010 | Owens | |
| 7,784,972 B2 | 8/2010 | Heffington | |
| 7,800,258 B2 | 9/2010 | Ito | |
| 7,819,556 B2 | 10/2010 | Heffington | |
| 7,885,070 B2 | 2/2011 | Campbell | |
| 7,885,074 B2 | 2/2011 | Campbell | |
| 7,907,406 B1 | 3/2011 | Campbell | |
| 7,916,483 B2 | 3/2011 | Campbell | |
| 7,921,853 B2 | 4/2011 | Fiset | |
| 7,944,694 B2 | 5/2011 | Campbell | |
| 7,961,475 B2 | 6/2011 | Campbell | |
| 7,983,040 B2 | 7/2011 | Campbell | |
| 8,014,150 B2 | 9/2011 | Campbell | |
| 8,018,720 B2 | 9/2011 | Campbell | |
| 8,059,405 B2 | 11/2011 | Campbell | |
| 8,066,900 B2 | 11/2011 | Owens | |
| 8,094,454 B2 | 1/2012 | Lowry | |
| 8,179,677 B2 | 5/2012 | Campbell | |
| 8,184,436 B2 | 5/2012 | Campbell | |
| 8,194,406 B2 | 6/2012 | Campbell | |
| 8,203,842 B2 | 6/2012 | Campbell | |
| 8,232,235 B2 | 7/2012 | Owens | |
| 8,248,801 B2 | 8/2012 | Campbell | |
| 8,280,468 B2 | 10/2012 | Takami | |
| 8,283,766 B2 | 10/2012 | Harada | |
| 8,289,039 B2 | 10/2012 | Breinlinger | |
| 8,290,319 B2 | 10/2012 | Harada | |
| 8,345,423 B2 | 1/2013 | Campbell | |
| 8,351,206 B2 | 1/2013 | Campbell | |
| 8,369,091 B2 | 2/2013 | Campbell | |
| 8,373,280 B2 | 2/2013 | Harada | |
| 8,378,677 B2 | 2/2013 | Morich | |
| 8,390,109 B2 | 3/2013 | Popovic | |
| 8,472,182 B2 | 6/2013 | Campbell | |
| 8,490,679 B2 | 7/2013 | Campbell | |
| 8,578,722 B2 * | 11/2013 | Jakobsen | F25B 9/008 62/509 |
| 8,619,425 B2 | 12/2013 | Campbell | |
| 8,713,957 B2 | 5/2014 | Campbell | |
| 8,720,219 B1 | 5/2014 | Sheik-Bahae | |
| 8,724,322 B2 | 5/2014 | Rinke | |
| 8,739,406 B2 | 6/2014 | Campbell | |
| 8,772,920 B2 | 7/2014 | Thacker | |
| 8,783,052 B2 | 7/2014 | Campbell | |
| 8,789,385 B2 | 7/2014 | Campbell | |
| 8,806,749 B2 | 8/2014 | Campbell | |
| 8,813,515 B2 | 8/2014 | Campbell | |
| 8,833,096 B2 | 9/2014 | Campbell | |
| 8,834,739 B1 | 9/2014 | Cumberland | |
| 8,867,209 B2 | 10/2014 | Campbell | |
| 8,929,080 B2 | 1/2015 | Campbell | |
| 8,934,250 B2 | 1/2015 | Campbell | |
| 8,941,994 B2 | 1/2015 | Campbell | |
| 8,947,873 B2 | 2/2015 | Campbell | |
| 8,953,317 B2 | 2/2015 | Campbell | |
| 8,953,320 B2 | 2/2015 | Campbell | |
| 8,955,346 B2 | 2/2015 | Campbell | |
| 8,955,347 B2 | 2/2015 | Campbell | |
| 8,959,941 B2 | 2/2015 | Campbell | |
| 8,964,390 B2 | 2/2015 | Campbell | |
| 8,964,391 B2 | 2/2015 | Campbell | |
| 8,966,922 B2 | 3/2015 | Campbell | |
| 9,009,971 B2 | 4/2015 | Campbell | |
| 9,042,098 B2 | 5/2015 | Campbell | |
| 9,042,099 B2 | 5/2015 | Campbell | |
| 9,049,800 B2 | 6/2015 | Shelnutt | |
| 9,051,293 B2 | 6/2015 | Nakamura | |
| 9,081,054 B2 | 7/2015 | Nishiura | |
| 9,095,942 B2 | 8/2015 | Campbell | |
| 9,101,078 B2 | 8/2015 | Campbell | |
| 9,144,179 B2 | 9/2015 | Shelnutt | |
| 9,195,282 B2 | 11/2015 | Shelnutt | |
| 9,209,165 B2 | 12/2015 | Dayringer | |
| 9,210,830 B2 | 12/2015 | Campbell | |
| 9,250,024 B2 | 2/2016 | Campbell | |
| 9,261,308 B2 | 2/2016 | Campbell | |
| 9,282,678 B2 | 3/2016 | Campbell | |
| 9,303,926 B2 | 4/2016 | Campbell | |
| 9,304,533 B2 | 4/2016 | Gusat | |
| 9,313,920 B2 * | 4/2016 | Campbell | F28B 3/04 |
| 9,328,964 B2 | 5/2016 | Shelnutt | |
| 9,332,674 B2 | 5/2016 | Campbell | |
| 9,334,371 B2 | 5/2016 | Nakamura | |
| 9,335,367 B2 | 5/2016 | Hebig | |
| 9,335,802 B2 | 5/2016 | Shelnutt | |
| 9,351,429 B2 | 5/2016 | Shelnutt | |
| 9,357,675 B2 | 5/2016 | Campbell | |

(56) References Cited

U.S. PATENT DOCUMENTS

| | | |
|---|---|---|
| 9,359,324 B2 | 6/2016 | Nakamura |
| 9,414,520 B2 | 8/2016 | Campbell |
| 9,433,132 B2 | 8/2016 | Krishnan |
| 9,459,280 B2 | 10/2016 | Johnson |
| 9,464,854 B2 | 10/2016 | Shelnutt |
| 9,471,089 B2 | 10/2016 | Gusat |
| 9,510,486 B1 | 11/2016 | Gravina |
| 9,516,792 B2 | 12/2016 | Krishnan |
| 9,543,787 B2 | 1/2017 | Duchesneau |
| 9,593,876 B2 | 3/2017 | Smith |
| 9,622,379 B1 | 4/2017 | Campbell |
| 9,625,183 B2 * | 4/2017 | Wallace ............... F25B 9/008 |
| 9,655,283 B2 | 5/2017 | James |
| 9,686,889 B2 | 6/2017 | Campbell |
| 9,713,290 B2 | 7/2017 | James |
| 9,738,757 B2 | 8/2017 | Nakamura |
| 9,750,159 B2 | 8/2017 | Campbell |
| 9,773,526 B2 | 9/2017 | Shelnutt |
| 9,832,913 B2 | 11/2017 | Shedd |
| 9,844,166 B2 | 12/2017 | Shelnutt |
| 9,848,509 B2 | 12/2017 | Shedd |
| 9,852,963 B2 | 12/2017 | Shedd |
| 9,854,713 B2 | 12/2017 | Krug, Jr. |
| 9,854,714 B2 | 12/2017 | Shedd |
| 9,854,715 B2 | 12/2017 | Shedd |
| 9,861,012 B2 | 1/2018 | Krug, Jr. |
| 9,861,013 B2 | 1/2018 | Edwards |
| 9,872,415 B2 | 1/2018 | Moss |
| 9,893,679 B2 | 2/2018 | Sampayan |
| 9,901,008 B2 | 2/2018 | Shedd |
| 9,901,013 B2 * | 2/2018 | Shedd ................ F25B 41/00 |
| 9,907,213 B1 | 2/2018 | Gravina |
| 9,918,409 B2 | 3/2018 | Edwards |
| 9,921,622 B2 | 3/2018 | Shelnutt |
| 9,936,606 B1 | 4/2018 | Kosugi |
| 9,945,576 B2 | 4/2018 | Lovicott |
| 9,960,150 B2 | 5/2018 | Bitz |
| 9,974,208 B2 | 5/2018 | Joshi |
| 9,992,914 B2 | 6/2018 | Best |
| 10,015,905 B2 | 7/2018 | Watanabe |
| 10,015,912 B2 | 7/2018 | Inano |
| 10,018,425 B2 | 7/2018 | Shelnutt |
| 10,020,436 B1 | 7/2018 | Gravina |
| 10,064,313 B2 | 8/2018 | Ishinabe |
| 10,070,560 B2 | 9/2018 | Campbell |
| 10,080,308 B2 | 9/2018 | Hirai |
| 10,082,849 B2 | 9/2018 | Chainer |
| 10,111,367 B2 | 10/2018 | Kodama |
| 10,123,453 B2 | 11/2018 | Saito |
| 10,123,454 B2 | 11/2018 | Saito |
| 10,123,463 B2 | 11/2018 | Best |
| 10,130,008 B2 | 11/2018 | Shepard |
| 10,143,113 B2 | 11/2018 | Shelnutt |
| 10,149,408 B2 | 12/2018 | Fujiwara |
| 10,156,873 B2 | 12/2018 | Shelnutt |
| 10,184,699 B2 | 1/2019 | Shedd |
| 10,194,559 B2 | 1/2019 | Saito |
| 10,204,659 B1 | 2/2019 | Keehn |
| 10,212,849 B2 | 2/2019 | Matsumoto |
| 10,225,951 B2 | 3/2019 | Fujiwara |
| 10,225,952 B2 * | 3/2019 | Chainer ............... G06F 1/20 |
| 10,240,845 B2 | 3/2019 | Smith |
| 10,251,318 B2 | 4/2019 | Krug, Jr. |
| 10,257,960 B1 | 4/2019 | Banerjee |
| 10,257,963 B2 | 4/2019 | Ozyalcin |
| 10,271,464 B2 | 4/2019 | Krug, Jr. |
| 10,285,309 B2 | 5/2019 | James |
| 10,306,799 B2 | 5/2019 | Saito |
| 10,321,609 B2 | 6/2019 | Hirai |
| 10,334,763 B2 | 6/2019 | Gao |
| 10,349,555 B2 | 7/2019 | Barragy |
| 10,356,958 B2 | 7/2019 | Inano |
| 10,399,190 B2 | 9/2019 | North |
| 10,401,924 B2 | 9/2019 | Saito |
| 10,405,457 B2 | 9/2019 | Boyd |
| 10,420,251 B2 | 9/2019 | Saito |
| 10,424,531 B2 | 9/2019 | Bitz |
| 10,458,665 B2 * | 10/2019 | Cho .................. F28C 3/005 |
| 10,477,726 B1 | 11/2019 | Enright |
| 10,481,650 B2 | 11/2019 | Saito |
| 10,502,483 B2 | 12/2019 | Gushanas |
| 10,512,192 B2 | 12/2019 | Miyoshi |
| 10,517,191 B2 | 12/2019 | Wakino |
| 10,524,387 B2 | 12/2019 | Tung |
| 10,528,094 B2 | 1/2020 | Saito |
| 10,528,096 B2 | 1/2020 | Chainer |
| 10,542,640 B1 | 1/2020 | Leigh |
| 10,560,765 B2 | 2/2020 | Ryan |
| 10,568,234 B1 | 2/2020 | Mao |
| 10,575,437 B1 | 2/2020 | Christiansen |
| 10,606,326 B2 | 3/2020 | Saito |
| 10,617,032 B1 | 4/2020 | Enright |
| 10,624,237 B2 | 4/2020 | Enright |
| 10,638,641 B2 | 4/2020 | Franz |
| 10,653,036 B1 | 5/2020 | Gao |
| 10,653,043 B2 | 5/2020 | Enright |
| 10,660,239 B2 | 5/2020 | Edwards |
| 10,662,359 B2 | 5/2020 | Lamanna |
| 10,667,427 B2 | 5/2020 | Gao |
| 10,667,434 B1 | 5/2020 | Mao |
| 10,674,637 B2 | 6/2020 | Ishinabe |
| 10,694,643 B2 | 6/2020 | Enright |
| 10,716,238 B2 | 7/2020 | Brink |
| 10,736,240 B2 | 8/2020 | Gao |
| 10,750,637 B1 | 8/2020 | Alissa |
| 10,765,033 B1 | 9/2020 | Keehn |
| 10,775,858 B2 | 9/2020 | Mao |
| 10,779,442 B2 | 9/2020 | Tung |
| 10,782,048 B2 * | 9/2020 | Park ................. F25B 5/04 |
| 10,791,647 B1 | 9/2020 | Miyamura |
| 10,809,775 B2 | 10/2020 | Saito |
| 10,813,254 B2 | 10/2020 | Marazzo |
| 10,820,446 B2 | 10/2020 | Boyd |
| 10,820,447 B1 | 10/2020 | Miyamura |
| 10,862,583 B2 | 12/2020 | Ryan |
| 10,881,020 B1 | 12/2020 | Liu |
| 10,888,031 B2 | 1/2021 | Franz |
| 10,888,032 B2 | 1/2021 | Wakino |
| 10,916,487 B2 | 2/2021 | Bitz |
| 10,920,753 B2 | 2/2021 | Stewart |
| 10,925,180 B2 | 2/2021 | Gao |
| 10,925,188 B1 | 2/2021 | Keehn |
| 10,932,390 B2 | 2/2021 | Korikawa |
| 10,939,580 B2 | 3/2021 | Gao |
| 10,939,589 B2 | 3/2021 | Krug, Jr. |
| 10,944,202 B1 | 3/2021 | Tung |
| 10,945,352 B2 | 3/2021 | Shen |
| 10,955,884 B2 | 3/2021 | Huang |
| 10,962,300 B2 | 3/2021 | Tung |
| 10,962,588 B1 | 3/2021 | Hart |
| 10,966,349 B1 | 3/2021 | Lau |
| 10,969,842 B2 | 4/2021 | Enright |
| 10,985,089 B2 | 4/2021 | Hart |
| 10,985,537 B2 | 4/2021 | Yang |
| 10,990,144 B2 | 4/2021 | Wang |
| 11,006,547 B2 | 5/2021 | Gao |
| 11,009,653 B2 | 5/2021 | Clatanoff |
| 11,009,925 B2 | 5/2021 | Saito |
| 11,013,143 B2 | 5/2021 | Saito |
| 11,013,144 B2 | 5/2021 | Enright |
| 11,023,021 B2 | 6/2021 | Saito |
| 11,032,941 B2 | 6/2021 | Le |
| 11,039,552 B2 | 6/2021 | Krug, Jr. |
| 11,044,141 B2 | 6/2021 | Hughes |
| 11,051,426 B2 | 6/2021 | Keehn |
| 11,058,029 B2 | 7/2021 | Saito |
| 11,064,634 B1 | 7/2021 | Enright |
| 11,071,232 B2 | 7/2021 | Ohga |
| 11,071,238 B2 | 7/2021 | Edmunds |
| 11,076,505 B2 * | 7/2021 | Gao .............. H05K 7/20381 |
| 11,076,508 B2 | 7/2021 | Gao |
| 11,083,110 B2 | 8/2021 | Krug, Jr. |
| 11,096,313 B2 | 8/2021 | Amos |
| 11,096,315 B2 | 8/2021 | Krug, Jr. |

(56) References Cited

U.S. PATENT DOCUMENTS

| | | |
|---|---|---|
| 11,101,630 B1 | 8/2021 | Lau |
| 11,102,912 B2 | 8/2021 | Enright |
| 11,116,106 B2 | 9/2021 | Harada |
| 11,116,113 B2 | 9/2021 | Chiu |
| 11,124,744 B2 | 9/2021 | Shellef |
| 11,129,298 B2 | 9/2021 | Enright |
| 11,130,277 B2 | 9/2021 | Rubinsky |
| 11,134,586 B2 | 9/2021 | Enright |
| 11,157,050 B1 | 10/2021 | Lunsman |
| 11,169,582 B2 | 11/2021 | Mao |
| 11,172,593 B2 | 11/2021 | Tian |
| 11,184,997 B2 | 11/2021 | Broderick |
| 11,188,214 B2 | 11/2021 | VanGilder |
| 11,219,142 B2 | 1/2022 | Chen |
| 11,224,144 B2 | 1/2022 | Enright |
| 2001/0037716 A1 | 11/2001 | Davidson |
| 2002/0003432 A1 | 1/2002 | Leas |
| 2002/0021557 A1 | 2/2002 | Ishimine |
| 2002/0112491 A1 | 8/2002 | Malone |
| 2002/0124995 A1 | 9/2002 | Moon |
| 2002/0135389 A1 | 9/2002 | Melgaard |
| 2002/0179284 A1 | 12/2002 | Joshi |
| 2003/0038688 A1 | 2/2003 | Mitrovic |
| 2003/0080413 A1 | 5/2003 | Dubhashi |
| 2003/0151883 A1 | 8/2003 | Hauptman |
| 2003/0177774 A1 | 9/2003 | Malone |
| 2004/0004435 A1 | 1/2004 | Hsu |
| 2004/0052280 A1 | 3/2004 | Rice |
| 2004/0118142 A1 | 6/2004 | Hsu |
| 2004/0165628 A1 | 8/2004 | Rice |
| 2006/0001435 A1 | 1/2006 | Teneketges |
| 2006/0080819 A1 | 4/2006 | McAllister |
| 2006/0090881 A1 | 5/2006 | Tuma |
| 2006/0230769 A1 | 10/2006 | Nogami |
| 2007/0082280 A1 | 4/2007 | Menchtchikov |
| 2007/0090853 A1 | 4/2007 | Menchtchikov |
| 2007/0193285 A1 | 8/2007 | Knight |
| 2007/0193721 A1 | 8/2007 | Tilton |
| 2007/0227710 A1 | 10/2007 | Belady |
| 2007/0276455 A1 | 11/2007 | Fiset |
| 2008/0151541 A1 | 6/2008 | Heffington |
| 2008/0174955 A1 | 7/2008 | Eddy |
| 2008/0219007 A1 | 9/2008 | Heffington |
| 2009/0014158 A1 | 1/2009 | Gu |
| 2009/0029890 A1 | 1/2009 | Owens |
| 2009/0055114 A1 | 2/2009 | Menchtchikov |
| 2009/0055115 A1 | 2/2009 | Menchtchikov |
| 2009/0058199 A1 | 3/2009 | Ito |
| 2009/0079453 A1 | 3/2009 | Teneketges |
| 2009/0186799 A1 | 7/2009 | Owens |
| 2009/0186800 A1 | 7/2009 | Owens |
| 2010/0101759 A1 | 4/2010 | Campbell |
| 2010/0101765 A1 | 4/2010 | Campbell |
| 2010/0103614 A1 | 4/2010 | Campbell |
| 2010/0103618 A1 | 4/2010 | Campbell |
| 2010/0103620 A1 | 4/2010 | Campbell |
| 2010/0118494 A1 | 5/2010 | Campbell |
| 2010/0188082 A1 | 7/2010 | Morich |
| 2010/0200797 A1 | 8/2010 | Owens |
| 2010/0231250 A1 | 9/2010 | Breinlinger |
| 2010/0263885 A1 | 10/2010 | Tuma |
| 2010/0326628 A1 | 12/2010 | Campbell |
| 2010/0328882 A1 | 12/2010 | Campbell |
| 2010/0328889 A1 | 12/2010 | Campbell |
| 2010/0328890 A1 | 12/2010 | Campbell |
| 2010/0328891 A1 | 12/2010 | Campbell |
| 2011/0065620 A1 | 3/2011 | Owens |
| 2011/0069453 A1 | 3/2011 | Campbell |
| 2011/0075373 A1 | 3/2011 | Campbell |
| 2011/0077161 A1 | 3/2011 | Takami |
| 2011/0103019 A1 | 5/2011 | Campbell |
| 2011/0122583 A1 | 5/2011 | Lowry |
| 2011/0132579 A1 | 6/2011 | Best |
| 2011/0212410 A1 | 9/2011 | Fiset |
| 2011/0259573 A1* | 10/2011 | Ezawa ............... F24F 5/0007 165/50 |
| 2011/0315343 A1 | 12/2011 | Campbell |
| 2011/0315344 A1 | 12/2011 | Campbell |
| 2011/0315353 A1 | 12/2011 | Campbell |
| 2011/0315355 A1 | 12/2011 | Campbell |
| 2011/0317367 A1 | 12/2011 | Campbell |
| 2012/0024501 A1 | 2/2012 | Campbell |
| 2012/0026691 A1 | 2/2012 | Campbell |
| 2012/0049376 A1 | 3/2012 | Harada |
| 2012/0051695 A1 | 3/2012 | Harada |
| 2012/0056327 A1 | 3/2012 | Harada |
| 2012/0090825 A1 | 4/2012 | Yarin |
| 2012/0111027 A1 | 5/2012 | Campbell |
| 2012/0111034 A1 | 5/2012 | Campbell |
| 2012/0111035 A1 | 5/2012 | Campbell |
| 2012/0111036 A1 | 5/2012 | Campbell |
| 2012/0210731 A1 | 8/2012 | Campbell |
| 2012/0211878 A1 | 8/2012 | Popovic |
| 2012/0243169 A1 | 9/2012 | Rinke |
| 2012/0286170 A1 | 11/2012 | Owens |
| 2012/0320527 A1 | 12/2012 | Nishiura |
| 2012/0324933 A1* | 12/2012 | Louvar ............... H05K 7/20327 62/196.4 |
| 2013/0015578 A1 | 1/2013 | Thacker |
| 2013/0019614 A1 | 1/2013 | Campbell |
| 2013/0021746 A1 | 1/2013 | Campbell |
| 2013/0021752 A1 | 1/2013 | Campbell |
| 2013/0068423 A1 | 3/2013 | Campbell |
| 2013/0068441 A1 | 3/2013 | Campbell |
| 2013/0081258 A1 | 4/2013 | Campbell |
| 2013/0091866 A1 | 4/2013 | Campbell |
| 2013/0091868 A1 | 4/2013 | Campbell |
| 2013/0105120 A1 | 5/2013 | Campbell |
| 2013/0105122 A1 | 5/2013 | Campbell |
| 2013/0111943 A1* | 5/2013 | Yoon ............... F25B 40/00 62/498 |
| 2013/0139998 A1 | 6/2013 | Hayashi |
| 2013/0180687 A1 | 7/2013 | Campbell |
| 2013/0296978 A1 | 11/2013 | Fiset |
| 2014/0055156 A1 | 2/2014 | Johnson |
| 2014/0060798 A1 | 3/2014 | Eckberg |
| 2014/0060799 A1 | 3/2014 | Eckberg |
| 2014/0068942 A1 | 3/2014 | Campbell |
| 2014/0071626 A1 | 3/2014 | Campbell |
| 2014/0071627 A1 | 3/2014 | Campbell |
| 2014/0082942 A1 | 3/2014 | Campbell |
| 2014/0085817 A1 | 3/2014 | Campbell |
| 2014/0085822 A1 | 3/2014 | Campbell |
| 2014/0085823 A1 | 3/2014 | Campbell |
| 2014/0107350 A1 | 4/2014 | Nakamura |
| 2014/0121293 A1 | 5/2014 | Nakamura |
| 2014/0123492 A1 | 5/2014 | Campbell |
| 2014/0123493 A1 | 5/2014 | Campbell |
| 2014/0124167 A1 | 5/2014 | Campbell |
| 2014/0124174 A1 | 5/2014 | Campbell |
| 2014/0133096 A1 | 5/2014 | Campbell |
| 2014/0133099 A1 | 5/2014 | Campbell |
| 2014/0146467 A1 | 5/2014 | Campbell |
| 2014/0146468 A1 | 5/2014 | Campbell |
| 2014/0183957 A1 | 7/2014 | Duchesneau |
| 2014/0216686 A1 | 8/2014 | Shelnutt |
| 2014/0216688 A1 | 8/2014 | Shelnutt |
| 2014/0216711 A1 | 8/2014 | Shelnutt |
| 2014/0218858 A1 | 8/2014 | Shelnutt |
| 2014/0218859 A1 | 8/2014 | Shelnutt |
| 2014/0218861 A1 | 8/2014 | Shelnutt |
| 2014/0263976 A1 | 9/2014 | Sampayan |
| 2014/0270731 A1 | 9/2014 | Gerling |
| 2014/0307360 A1 | 10/2014 | Parkin |
| 2014/0355204 A1 | 12/2014 | Gusat |
| 2014/0355212 A1 | 12/2014 | Campbell |
| 2015/0000319 A1 | 1/2015 | Smith |
| 2015/0013940 A1 | 1/2015 | Best |
| 2015/0013960 A1 | 1/2015 | Best |
| 2015/0022975 A1 | 1/2015 | Browne |
| 2015/0025601 A1 | 1/2015 | Fiset |
| 2015/0043165 A1 | 2/2015 | Best |
| 2015/0049432 A1 | 2/2015 | Best |

(56) References Cited

U.S. PATENT DOCUMENTS

| | | |
|---|---|---|
| 2015/0060009 A1 | 3/2015 | Shelnutt |
| 2015/0061712 A1 | 3/2015 | Hebig |
| 2015/0062806 A1 | 3/2015 | Shelnutt |
| 2015/0070846 A1 | 3/2015 | Shelnutt |
| 2015/0108615 A1 | 4/2015 | Dayringer |
| 2015/0109728 A1 | 4/2015 | Campbell |
| 2015/0109729 A1 | 4/2015 | Campbell |
| 2015/0109730 A1 | 4/2015 | Campbell |
| 2015/0109735 A1 | 4/2015 | Campbell |
| 2015/0138723 A1 | 5/2015 | Shedd |
| 2015/0181762 A1 | 6/2015 | Boyd |
| 2015/0189796 A1 | 7/2015 | Shedd |
| 2015/0192368 A1 | 7/2015 | Shedd |
| 2015/0195953 A1 | 7/2015 | Best |
| 2015/0197501 A1 | 7/2015 | Nakamura |
| 2015/0208549 A1 | 7/2015 | Shedd |
| 2015/0230366 A1 | 8/2015 | Shedd |
| 2015/0233619 A1 | 8/2015 | Shedd |
| 2015/0237767 A1 | 8/2015 | Shedd |
| 2015/0257303 A1 | 9/2015 | Shedd |
| 2015/0351281 A1 | 12/2015 | Campbell |
| 2015/0351290 A1 | 12/2015 | Shedd |
| 2015/0359132 A1 | 12/2015 | Campbell |
| 2015/0382511 A1 | 12/2015 | James |
| 2015/0382515 A1 | 12/2015 | James |
| 2016/0014932 A1 | 1/2016 | Best |
| 2016/0044824 A1 | 2/2016 | North |
| 2016/0044833 A1 | 2/2016 | Krishnan |
| 2016/0102880 A1 | 4/2016 | Lovicott |
| 2016/0113149 A1 | 4/2016 | Krug, Jr. |
| 2016/0113150 A1 | 4/2016 | Krug, Jr. |
| 2016/0116224 A1 | 4/2016 | Shedd |
| 2016/0118317 A1 | 4/2016 | Shedd |
| 2016/0120019 A1 | 4/2016 | Shedd |
| 2016/0120058 A1 | 4/2016 | Shedd |
| 2016/0120059 A1 | 4/2016 | Shedd |
| 2016/0120064 A1 | 4/2016 | Shedd |
| 2016/0120065 A1 | 4/2016 | Shedd |
| 2016/0120071 A1 | 4/2016 | Shedd |
| 2016/0123637 A1 | 5/2016 | Moreno |
| 2016/0128238 A1 | 5/2016 | Shedd |
| 2016/0209865 A1 | 7/2016 | Gusat |
| 2016/0222168 A1 | 8/2016 | Nakamura |
| 2016/0234970 A1 | 8/2016 | Shelnutt |
| 2016/0240226 A1 | 8/2016 | Shelnutt |
| 2016/0242319 A1 | 8/2016 | Edwards |
| 2016/0242326 A1 | 8/2016 | Edwards |
| 2016/0286685 A1 | 9/2016 | Joshi |
| 2016/0286694 A1 | 9/2016 | Krishnan |
| 2016/0298883 A1* | 10/2016 | Louvar ............... H05K 7/20827 |
| 2016/0349810 A1 | 12/2016 | Chainer |
| 2016/0349811 A1 | 12/2016 | Chainer |
| 2016/0366792 A1 | 12/2016 | Smith |
| 2016/0377333 A1* | 12/2016 | Bertagnolio .......... F25B 49/005 62/56 |
| 2017/0013744 A1 | 1/2017 | Shelnutt |
| 2017/0064862 A1 | 3/2017 | Miyoshi |
| 2017/0071079 A1 | 3/2017 | Krishnan |
| 2017/0105313 A1 | 4/2017 | Shedd |
| 2017/0127565 A1 | 5/2017 | Campbell |
| 2017/0127576 A1 | 5/2017 | Campbell |
| 2017/0156233 A1 | 6/2017 | Moss |
| 2017/0167712 A1 | 6/2017 | Melzner |
| 2017/0177041 A1 | 6/2017 | Shelnutt |
| 2017/0215299 A1 | 7/2017 | James |
| 2017/0223870 A1 | 8/2017 | Smith |
| 2017/0265328 A1 | 9/2017 | Sasaki |
| 2017/0269651 A1 | 9/2017 | Huang |
| 2017/0271843 A1 | 9/2017 | Batchelder |
| 2017/0273223 A1 | 9/2017 | Saito |
| 2017/0280587 A1 | 9/2017 | Watanabe |
| 2017/0290198 A1 | 10/2017 | Shepard |
| 2017/0295676 A1 | 10/2017 | Conn |
| 2017/0303443 A1 | 10/2017 | Inano |
| 2017/0311479 A1 | 10/2017 | Barragy |
| 2017/0311484 A1 | 10/2017 | Ozyalcin |
| 2017/0325358 A1 | 11/2017 | Franz |
| 2017/0332514 A1 | 11/2017 | Saito |
| 2017/0354061 A1 | 12/2017 | Saito |
| 2017/0354066 A1 | 12/2017 | Kodama |
| 2017/0358556 A1 | 12/2017 | Bitz |
| 2018/0020570 A1 | 1/2018 | Fujiwara |
| 2018/0020571 A1 | 1/2018 | Saito |
| 2018/0020572 A1 | 1/2018 | Fujiwara |
| 2018/0027696 A1 | 1/2018 | Franz |
| 2018/0035569 A1 | 2/2018 | Harrington |
| 2018/0070477 A1 | 3/2018 | Saito |
| 2018/0084670 A1 | 3/2018 | Hirai |
| 2018/0084671 A1 | 3/2018 | Matsumoto |
| 2018/0084676 A1 | 3/2018 | Edwards |
| 2018/0084677 A1 | 3/2018 | Krug, Jr. |
| 2018/0084678 A1 | 3/2018 | Krug, Jr. |
| 2018/0092243 A1 | 3/2018 | Saito |
| 2018/0098464 A1 | 4/2018 | Ishinabe |
| 2018/0132386 A1 | 5/2018 | Tung |
| 2018/0153058 A1 | 5/2018 | Hirai |
| 2018/0196484 A1 | 7/2018 | Saito |
| 2018/0219002 A1 | 8/2018 | Bitz |
| 2018/0246550 A1 | 8/2018 | Inaba |
| 2018/0288906 A1 | 10/2018 | Hopton |
| 2018/0295752 A1* | 10/2018 | Tang ................. H05K 7/20827 |
| 2018/0304537 A1 | 10/2018 | Rubinsky |
| 2018/0317346 A1 | 11/2018 | Best |
| 2018/0341298 A1 | 11/2018 | Cheng |
| 2018/0343770 A1 | 11/2018 | Brink |
| 2018/0356866 A1 | 12/2018 | Saito |
| 2018/0363993 A1 | 12/2018 | Saito |
| 2018/0363994 A1 | 12/2018 | Saito |
| 2018/0376615 A1 | 12/2018 | Saito |
| 2019/0008077 A1 | 1/2019 | Ishinabe |
| 2019/0037732 A1 | 1/2019 | Krug, Jr. |
| 2019/0045661 A1 | 2/2019 | Broderick |
| 2019/0056154 A1 | 2/2019 | Jansen |
| 2019/0059176 A1 | 2/2019 | Saito |
| 2019/0082556 A1 | 3/2019 | Inano |
| 2019/0098796 A1 | 3/2019 | Wakino |
| 2019/0113247 A1 | 4/2019 | LePoudre |
| 2019/0119609 A1 | 4/2019 | Shellef |
| 2019/0141861 A1 | 5/2019 | Shedd |
| 2019/0150323 A1 | 5/2019 | Krug, Jr. |
| 2019/0150324 A1 | 5/2019 | Krug, Jr. |
| 2019/0150325 A1 | 5/2019 | Krug, Jr. |
| 2019/0150326 A1 | 5/2019 | Gao |
| 2019/0159359 A1 | 5/2019 | Tung |
| 2019/0166726 A1 | 5/2019 | Tung |
| 2019/0179382 A1 | 6/2019 | Saito |
| 2019/0182990 A1* | 6/2019 | Chen ................. H05K 7/20736 |
| 2019/0196557 A1 | 6/2019 | Saito |
| 2019/0200482 A1 | 6/2019 | Boyd |
| 2019/0206764 A1 | 7/2019 | Kulkarni |
| 2019/0208664 A1 | 7/2019 | Saito |
| 2019/0219311 A1 | 7/2019 | Smith |
| 2019/0223324 A1 | 7/2019 | Le |
| 2019/0235591 A1 | 8/2019 | Saito |
| 2019/0246518 A1 | 8/2019 | Shen |
| 2019/0289748 A1 | 9/2019 | Saito |
| 2019/0293358 A1 | 9/2019 | Kandlikar |
| 2019/0294220 A1 | 9/2019 | Saito |
| 2019/0294221 A1 | 9/2019 | Saito |
| 2019/0297747 A1 | 9/2019 | Wakino |
| 2019/0317570 A1 | 10/2019 | Saito |
| 2019/0333840 A1 | 10/2019 | Bitz |
| 2019/0335252 A1 | 10/2019 | Ryan |
| 2019/0338962 A1 | 11/2019 | Minnoy |
| 2019/0357384 A1 | 11/2019 | Saito |
| 2019/0357385 A1 | 11/2019 | Miyazaki |
| 2019/0364699 A1 | 11/2019 | Gao |
| 2019/0374105 A1 | 12/2019 | Raylman |
| 2020/0002589 A1 | 1/2020 | Lamanna |
| 2020/0006197 A1 | 1/2020 | Hart |
| 2020/0015383 A1 | 1/2020 | Gao |
| 2020/0022289 A1 | 1/2020 | Marazzo |
| 2020/0025451 A1 | 1/2020 | Stone |
| 2020/0089293 A1 | 3/2020 | Enright |

(56) References Cited

U.S. PATENT DOCUMENTS

| | | | |
|---|---|---|---|
| 2020/0091686 A1 | 3/2020 | Yang | |
| 2020/0093024 A1 | 3/2020 | Enright | |
| 2020/0093025 A1 | 3/2020 | Enright | |
| 2020/0093026 A1 | 3/2020 | Enright | |
| 2020/0093032 A1 | 3/2020 | Enright | |
| 2020/0093037 A1 | 3/2020 | Enright | |
| 2020/0093038 A1 | 3/2020 | Enright | |
| 2020/0113083 A1 | 4/2020 | Schon | |
| 2020/0113085 A1* | 4/2020 | Schon | F25D 17/02 |
| 2020/0120831 A1 | 4/2020 | Saito | |
| 2020/0132388 A1 | 4/2020 | Cheng | |
| 2020/0145099 A1 | 5/2020 | Ryan | |
| 2020/0150731 A1 | 5/2020 | Wang | |
| 2020/0158443 A1 | 5/2020 | Tung | |
| 2020/0166246 A1* | 5/2020 | Eadelson | F25B 23/006 |
| 2020/0178414 A1 | 6/2020 | Bulinski | |
| 2020/0199427 A1 | 6/2020 | Stewart | |
| 2020/0205318 A1 | 6/2020 | Hulse | |
| 2020/0253086 A1 | 8/2020 | Ohga | |
| 2020/0257342 A1 | 8/2020 | Mao | |
| 2020/0258810 A1 | 8/2020 | Ghosh | |
| 2020/0260613 A1 | 8/2020 | Winkel | |
| 2020/0267872 A1 | 8/2020 | Harada | |
| 2020/0281093 A1 | 9/2020 | Korikawa | |
| 2020/0284522 A1 | 9/2020 | Chen | |
| 2020/0288600 A1 | 9/2020 | Gao | |
| 2020/0288601 A1 | 9/2020 | Gao | |
| 2020/0292200 A1* | 9/2020 | Li | F25B 13/00 |
| 2020/0305307 A1 | 9/2020 | Amos | |
| 2020/0305310 A1 | 9/2020 | Alissa | |
| 2020/0315059 A1 | 10/2020 | Gao | |
| 2020/0318861 A1 | 10/2020 | Kikuchi | |
| 2020/0323100 A1 | 10/2020 | Chiu | |
| 2020/0323108 A1 | 10/2020 | Bilan | |
| 2020/0323109 A1 | 10/2020 | Navarro | |
| 2020/0328139 A1 | 10/2020 | Chiu | |
| 2020/0329551 A1 | 10/2020 | Yamamoto | |
| 2020/0370845 A1 | 11/2020 | Saito | |
| 2020/0371569 A1 | 11/2020 | Mao | |
| 2020/0375059 A1 | 11/2020 | Keehn | |
| 2020/0379164 A1 | 12/2020 | Clatanoff | |
| 2020/0386488 A1 | 12/2020 | Smith | |
| 2020/0389997 A1 | 12/2020 | Tung | |
| 2020/0390007 A1 | 12/2020 | Edmunds | |
| 2020/0393206 A1 | 12/2020 | Liu | |
| 2020/0404805 A1 | 12/2020 | Gao | |
| 2020/0404813 A1 | 12/2020 | Gao | |
| 2020/0409435 A1 | 12/2020 | Drake | |
| 2021/0007244 A1 | 1/2021 | Nizinkiewicz | |
| 2021/0014105 A1 | 1/2021 | Hughes | |
| 2021/0018356 A1 | 1/2021 | Bean, Jr. | |
| 2021/0022263 A1 | 1/2021 | Enright | |
| 2021/0057787 A1 | 2/2021 | Yang | |
| 2021/0059079 A1 | 2/2021 | Keehn | |
| 2021/0075148 A1 | 3/2021 | Tung | |
| 2021/0102294 A1 | 4/2021 | Miljkovic | |
| 2021/0103320 A1 | 4/2021 | Saito | |
| 2021/0104788 A1 | 4/2021 | Shao | |
| 2021/0112683 A1 | 4/2021 | Mohajer | |
| 2021/0120705 A1 | 4/2021 | Enright | |
| 2021/0122962 A1 | 4/2021 | Allgood | |
| 2021/0125899 A1 | 4/2021 | Bitz | |
| 2021/0126304 A1 | 4/2021 | Shao | |
| 2021/0139441 A1 | 5/2021 | Petrov | |
| 2021/0144885 A1 | 5/2021 | Enright | |
| 2021/0148608 A1 | 5/2021 | Gao | |
| 2021/0148643 A1 | 5/2021 | Tung | |
| 2021/0153391 A1* | 5/2021 | Gao | H05K 7/20327 |
| 2021/0153392 A1 | 5/2021 | Gao | |
| 2021/0156601 A1* | 5/2021 | Melink | F25B 13/00 |
| 2021/0166991 A1 | 6/2021 | Liu | |
| 2021/0176897 A1 | 6/2021 | Naderi | |
| 2021/0176898 A1 | 6/2021 | Naderi | |
| 2021/0185850 A1 | 6/2021 | Kulkarni | |
| 2021/0204451 A1 | 7/2021 | Keehn | |
| 2021/0219463 A1 | 7/2021 | Raman | |
| 2021/0221776 A1 | 7/2021 | Smith | |
| 2021/0234343 A1 | 7/2021 | Yang | |
| 2021/0239927 A1 | 8/2021 | Rivaud | |
| 2021/0246886 A1 | 8/2021 | Lamanna | |
| 2021/0270252 A1 | 9/2021 | Stewart | |
| 2021/0274677 A1 | 9/2021 | Enright | |
| 2021/0274687 A1 | 9/2021 | Chen | |
| 2021/0276410 A1 | 9/2021 | Islam | |
| 2021/0281149 A1 | 9/2021 | Islam | |
| 2021/0284892 A1 | 9/2021 | Lamanna | |
| 2021/0285728 A1 | 9/2021 | Tung | |
| 2021/0289659 A2 | 9/2021 | Subrahmanyam | |
| 2021/0289662 A1 | 9/2021 | Tung | |
| 2021/0298198 A1 | 9/2021 | Bostick | |
| 2021/0302074 A1 | 9/2021 | Artman | |
| 2021/0303145 A1 | 9/2021 | VanGilder | |
| 2021/0321526 A1 | 10/2021 | Kulkarni | |
| 2021/0321534 A1 | 10/2021 | Amos | |
| 2021/0321535 A1 | 10/2021 | Amos | |
| 2021/0321542 A1 | 10/2021 | Edmunds | |
| 2021/0327787 A1 | 10/2021 | Yang | |
| 2021/0333846 A1 | 10/2021 | Lunsman | |
| 2021/0337704 A1 | 10/2021 | Enright | |
| 2021/0340421 A1 | 11/2021 | Simoni | |
| 2021/0344255 A1 | 11/2021 | Said | |
| 2021/0348044 A1 | 11/2021 | Stewart | |
| 2021/0348624 A1 | 11/2021 | Diglio | |
| 2021/0351106 A1 | 11/2021 | Subrahmanyam | |
| 2021/0351108 A1 | 11/2021 | Diglio | |
| 2021/0356180 A1 | 11/2021 | Miozza | |
| 2021/0357346 A1 | 11/2021 | Li | |
| 2021/0368647 A1 | 11/2021 | Boucher | |
| 2021/0368655 A1 | 11/2021 | Gao | |
| 2021/0378140 A1 | 12/2021 | Enright | |
| 2021/0378148 A1 | 12/2021 | Chen | |
| 2021/0382533 A1 | 12/2021 | Heydari | |
| 2021/0385971 A1 | 12/2021 | Gorius | |
| 2021/0385974 A1 | 12/2021 | Ong Kong Chye | |
| 2021/0392776 A1 | 12/2021 | Tuma | |
| 2021/0395213 A1 | 12/2021 | Bulinski | |
| 2021/0400813 A1 | 12/2021 | Thibado | |
| 2021/0410292 A1 | 12/2021 | Yang | |
| 2021/0410317 A1 | 12/2021 | Geng | |
| 2021/0410319 A1 | 12/2021 | Manousakis | |
| 2021/0410320 A1 | 12/2021 | Yang | |
| 2021/0410328 A1 | 12/2021 | Yang | |
| 2021/0410329 A1 | 12/2021 | Yang | |
| 2021/0410337 A1 | 12/2021 | Chen | |
| 2022/0003433 A1 | 1/2022 | Lee | |
| 2022/0004475 A1 | 1/2022 | Benoit | |
| 2022/0007548 A1 | 1/2022 | Lee | |
| 2022/0011834 A1 | 1/2022 | Heydari | |
| 2022/0011835 A1 | 1/2022 | Heydari | |
| 2022/0015266 A1 | 1/2022 | Narain | |

* cited by examiner

P-h diagram of Novec 7000

REGENERATIVE PREHEATER FOR PHASE CHANGE COOLING APPLICATIONS

CROSS REFERENCE TO RELATED APPLICATIONS

The present application is a Continuation of U.S. patent application Ser. No. 17/588,209, filed Jan. 28, 2022, now abandoned, the entirety of which is expressly incorporated herein by reference.

FIELD OF THE INVENTION

The present invention relates to the field of phase change cooling for IT servers.

BACKGROUND OF THE INVENTION

Each cited reference is expressly incorporated herein by reference in its entirety.

Increasing power densities in data centers due to the rise of Artificial Intelligence (AI), high-performance computing (HPC) and machine learning compel engineers to develop new cooling strategies and designs for high-density data centers.

Cooling of servers in datacenters is an evolving technology. An emerging trend is use of phase change fluids to provide high-capacity cooling. In a typical system, a phase change fluid, often a hydrofluorocarbon based compound, e.g., a hydrofluorocarbon ether, is provided having a boiling point of 25-75 C at a desired operating pressure, which may be from −8 to 200 psig. For example, R1234ZE has a boiling point of about 50 C at 140 psig. Typical silicon integrate circuits operate at less than 110 C, and typically, the cooling system seeks to cool them below 65 C. This allows relatively low-pressure containment systems with self-regulation of temperature, i.e., the system is operable without thermostatic controls over flow or pressures, and passively responds to changes in power consumption. In these systems, an evaporator located in place of a traditional heatsink on top of a power dissipating chip receives an influx that may be liquid or mixed liquid and gas, and produces an efflux that is a mixture of liquid and gas (up to the thermal capacity of the system). A series of evaporators may be placed in series to simplify fluidic connections. See, U.S. 20210148608; 20210120705; 20210022263; 20200404813; 20200404805; 20200284522; 20200093038; 20200093037; 20200093026; 20200093025; 20200093024; 20200089293; 20190293358; 20190206764; 20190113247; 20190056154; 20180341298; 20180317346; and 20180035569.

In the series of evaporators, the heat energy per gram of refrigerant increases through the loop in the server, as does its volume. Where the refrigerant is pure or azeotropic, the boiling temperature will change with pressure, but at constant pressure the boiling point is the same. Under homogeneous pressure and mixing, the boiling temperature will tend to be uniform. In an evaporator or evaporator system with a significant vertical dimension, there will be a gravitational pressure gradient that changes the boiling temperature with height. In non-azeotropic or quasi-azeotropic fluids, the boiling point will vary with the composition of the fluid, and regional differences will occur even at constant pressure. The components of the composition will fractionate liquid and gas phases, and with progressive fractionation, the liquid will have dynamically changing thermodynamic characteristics.

In general, a pure phase change liquid is used, such as Novec 7000 (Methyl perfluoropropyl ether, 1-Methoxyheptafluoropropane, $CF_3CF_2CF_2OCH_3$) or 7100 (methoxy-nonafluorobutane ($CF_3CF_2CF_2$ $CF_2F_9OCH_3$)). Segregated hydrofluoroethers (HFEs), supplied by the 3M Company [3M HTF] as Novec 7000-series fluids, have an excellent blend of thermal transport, safety, and environmental properties that make them good candidates for a secondary heat transfer system. They share many of the valuable performance properties of PFCs and are positioned by 3M as sustainable alternatives to PFCs, with much lower GWPs.

Other refrigerants, such as R-134a may be used. See also en.wikipedia.org/wiki/List_of_refrigerants, expressly incorporated herein by reference. Preferred refrigerants are those that are environmentally benign sufficient to meet regulatory restrictions, non-toxic, and have a boiling point of 0-100° C. at pressures between 0.5-30 bar. More preferably, they have a boiling point of 25-65° C. at 1-4 bar.

In order to recycle the gas phase of the refrigerant, a pump compresses the gas, and a condensing heat exchanger withdraws heat, often using cold water or air, to return the gas to a liquid state. The liquid is subcooled, e.g., at the temperature of the cold water or air, below the boiling point of the fluid at the pump outlet pressure. At the interface with the rack, a subcooled liquid refrigerant enters, while under normal operating conditions where the server sheds heat and pressure is reduced, a lower density mix of liquid and gas is returned. The subcooled fluid entering the rack has an increased thermal capacity but lower heat transfer coefficient as compared to a fluid at the boiling point. The system is typically designed to provide a general excess of cooling capacity, i.e., some liquid refrigerant is typically returned from the last evaporator in the circuit.

The evaporator is typically designed to efficiently operate in a phase change heat transfer mode, provided with an effective surface area dependent on the available heat transfer rate of the refrigerant at the boiling point. When subcooled refrigerant is provided, a potential inefficiency is present, especially in the first evaporator in the series.

When the heat transfer coefficient in the evaporator is low, the temperature difference between the integrated circuit to be cooled and the refrigerant will increase, and in some cases, the integrated circuit to be cooled will run hotter when subcooled refrigerant is suppled than when a saturated refrigerant is supplied. On the other hand, increasing the size of the evaporator to accommodate the lower heat transfer coefficient may lead to increased pressure drop or pumping cost.

Therefore, the presence of subcooling may lead to a full or partial single phase operation especially in the first evaporator, which translates to a less efficient heat transfer, higher temperature variability, and greater instances of thermal throttling compared with when subcooling is smaller.

Two-phase cooling is one of the promising technologies which exploits the latent heat of the fluid. This technology is much more effective in removing high heat fluxes than when using the sensible heat of fluid and requires lower coolant flow rates. The latent heat also implies more uniformity in the temperature of a heated surface. Despite the benefits of two-phase cooling, the phase change adds complexities to a system when multiple evaporators (exposed to different heat fluxes potentially) are connected to one coolant distribution unit (CDU).

See, Khalili, Sadegh, Srikanth Rangarajan, Vadim Gektin, Husam Alissa, and Bahgat Sammakia. "An Experimental Investigation on the Fluid Distribution in a Two-Phase Cooled Rack Under Steady and Transient Information Technology Loads." Journal of Electronic Packaging 142, no. 4 (2020): 041002, incorporated herein by reference.

An IBM study [4] showed that cooling efficiency with liquid cooling can be 3500 times higher than air cooling. Liquid cooling also possesses additional benefits such as reduced noise level due to a reduced number and/or speed of server fans in liquid-cooled servers.

Saums [8] demonstrated that the cooling capacity can be boosted by 2 and 2.5 times in an electronics system by using a pumped two-phase cooling technology compared with single phase liquid and air-cooled solutions, respectively. Direct two-phase cooling is an emerging technology that can be deployed in data centers to cool high-density servers and racks efficiently [9]. Kulkarni et al. [5] demonstrated that two-phase cooling can be used for cooling multiple chips with cold plates that are connected in series. They successfully dissipated a total heat load of 4 kW on a single board via two separate cooling loops (2 kW per loop) using 12 serried cold plates per loop. Valenzuela et al. [10] studied the behavior of a pumped refrigerant two-phase cooling system by considering two evaporators at different elevations to mimic a rack-scale system.

In a prototype system, a coolant distribution unit (CDU) is deployed at the bottom of the rack to supply a dielectric engineered fluid (Novec HFE-7000 [11]) to the evaporators through a U-shape manifold. The boiling point of Novec-7000 is 34° C. at atmospheric pressure [11]. The CDU is deployed at the bottom of the rack and is responsible for supplying the coolant to the manifold via a centrifugal pump and transferring the absorbed heat in the secondary loop by the coolant to a chilled water loop from the building (primary loop) through a liquid-liquid heat exchanger (HX). The heat exchanger is connected to the reservoir directly with the intent to use the reservoir as a direct-contact condenser.

A schematic of the CDU (top view), its components, and the primary and secondary cooling loops is shown in FIG. 2.

The prototype was instrumented. A thermocouple and a pressure sensor were installed in the loops at up- and downstream of each evaporator. Additionally, a flow meter was dedicated to each evaporator loop in the instrumented servers. Also, a flow meter was installed between the pump and the manifold to measure the total flow rate supplied by the CDU. The relative location of the instrumentation with respect to evaporators A and B is shown in FIG. 2. Transparent tubing was used at the outlet of the evaporators to allow a visual inspection of the vapor quality. Two K-type thermocouples were installed in the CDU to monitor the supply and return temperatures of the coolant in the secondary loop. Also, two absolute pressure sensors with a range of 100 psi and accuracy of ±0.5% full scale were installed after the pump of the secondary loop and in the reservoir to monitor the supply and return pressures. A full scope of instrumentation is not typically required for production use.

Two separate centrifugal pumps were used for circulating the coolant between the reservoir and servers, and the reservoir and the HX. The intakes of the pumps were connected to the bottom of the reservoir to ensure liquid is fed to the pumps. The power consumption of the pumps was calculated by measuring voltage and current delivered to the pumps and is approximately 250 W per pump. A manual venting valve was installed at the top of the reservoir. This valve allows extracting trapped air after filling the system.

A manifold with 32 pairs of ports was mounted vertically on the rack which distributes the coolant between the servers. Non-spill quick-connects/disconnect fittings were used which facilitate the maintenance of the servers. An adjustable differential pressure bypass valve 66 at the top of the manifold allows controlling the pressure differential between the supply and return sides of the manifold. This spring-loaded bypass valve 66 bypasses the additional pressure differential created by the pump when some of the servers are disconnected. It can also be used for adjusting the supplied flow rate to the servers via changing the differential pressure between the supply and return sides of the manifold. To minimize the number of parameters impacting the flow, the bypass valve 66 was closed. Four pressure sensors were connected to the top and bottom of the supply and return sides of the manifold as shown in FIG. 2. This allows measuring ΔP along the manifold and between the supply and return sides of the manifold. The numbering system for these pressure sensors is shown on the manifold in FIG. 2.

The supply water temperature (SWT) in the primary loop was set to 20° C. which is approximately equal to the supplied air temperature in the cold aisle. The relation between the saturation temperature and pressure for Novec HFE-7000 is shown on a pressure-enthalpy (p-h) diagram in FIG. 3. The available latent heat decreases when pressure (and consequently, the saturation temperature) increases. So, the capacity of the cooling system is higher at lower pressures. However, the pressure in the system must be regulated to avoid cavitation in the pump which set a lower limit for the operating pressure of a given system. Also, the large ratio of the specific volume of vapor to the specific volume of liquid at low pressures can increase the chance of flow instabilities.

In a closed-loop cooling system (without a variable volume accumulator), the overall volume of the cooling loop is constant, hence, the thermodynamic state at any location in the of the system is a function of pressure and temperatures.

The operating pressure at each point of the system is a function of the ratio of the initial volume of charged liquid at ambient temperature and the total volume of the cooling system (filling ratio). As mentioned earlier, the coolant pressure determines the saturation temperature at a given point, e.g., the local pressure in an evaporator determines the boiling temperature of the coolant, hence, the degree of subcooling. As a result, chip temperatures and vapor quality at the outlet of an evaporator also depend on the operating pressure of the cooling system.

The reservoir pressure may be adjusted by changing the filling ratio of the cooling system. Pressure in the reservoir is the lowest pressure in the loop (except at the intake of the pump). At the initial stage, the system is charged under pressure to achieve the relatively high pressure of 227.5 kPa (33 psi) in the reservoir. The corresponding saturation temperature at this pressure is approximately 60° C., which means that the coolant in the reservoir is significantly subcooled. The degree of subcooling increases even further as the liquid passes the pump. Variations of the supply pressure and degree of subcooling at various locations as a function of the reservoir pressure are shown in FIG. 4. As expected, the supply pressure decreases proportionally with the reservoir pressure. Also, the degree of subcooling in the reservoir and after the pump decreases as the reservoir pressure is reduced. Although the subcooling is significant after the pump, it reduces along the coolant path as it elevates in the manifold and passes through the quick connects, tubing, and evaporators (see the degree of subcooling at the inlet of server 1 in FIG. 4).

The uniformity of flow through the ports of the manifold depends on multiple parameters such as the ratio of the length to the diameter of the manifold and average total head loss coefficient for the port flow [14]. In this case, a large drop is observed in the flow rate of servers 1 and 5 at lower reservoir pressures. The degree of subcooling at the inlet of evaporators of servers that are located at a higher elevation is lower compared to the rest of the servers. As a result, it is expected that nucleation initiates at a lower power in this server compared to other similar servers in the rack.

In other words, for a given CPU power, the available capacity associated with the sensible heat is smaller in servers at a higher elevation, and more heat is picked up by the latent heat of the coolant in them which translates to a higher vapor quality at the outlet of these servers.

A control system may be provided to adjusts the primary loop temperature (SWT) based on an error signal and the rate of change in the error signal. The error signal is defined as the difference between the current temperature of the supplied coolant and a desired setpoint.

Subcooling is inevitable in a typical pumped cooling system due to the inherent pressure rise in the pump which increases the saturation temperature of the coolant. The magnitude of subcooling can be mitigated by a proper choice and sizing of components based on the expected heat load on the system.

Khalili et al. (2020) found that the impact of the hydrostatic pressure on the flow distribution is significant. The hydrostatic pressure changes the degree of subcooling at the inlet of servers across the rack, hence, servers at higher elevations experience a higher vapor generation rate at a given heat load which, in turn, affects the uniformity of flow delivery across the rack significantly, i.e., the flow rate through servers at higher elevations can be significantly lower than the servers at lower elevations. To achieve a more uniform flow distribution, the manifold can be designed to decrease the impact of hydrostatic pressure or high-power equipment may be situated at lower elevations in a heterogenous rack.

US 2020/0113085 involves a two-phase system to recover and utilize waste heat while cooling devices focused on reducing energy consumption with large-scale data centers in mind as well as other facilities with a significant number of electronic devices that consume large amounts of power. A system and a method are provided for cooling devices and recovering waste heat. A plurality of heat absorption devices in direct or indirect thermal contact with a plurality of electronic devices, and comprise channels to receive an evaporable working liquid, which becomes a first two-phase mixture having a first liquid portion and a first vapor portion upon absorption of heat from the devices. A compressor compresses the first vapor portion having elevated pressure and temperature. A heat exchanger condenses the compressed vapor to liquid so as to release the heat. An expansion device is used to expand the liquid to provide a second two-phase mixture comprising a second liquid portion and a second vapor portion. In at least one vapor-liquid separator, the first liquid portion and the second liquid portion are fed back to the plurality of heat absorption devices. The second vapor portion is fed back to the at least one compressor.

U.S. Pat. No. 10,502,483 demonstrates a method for cooling and liquefying gas in a heat exchanger. The patent discusses also using the heat exchanger as a method of subcooling in the system before the mixture arrives at the compressor. A system and method is provided for cooling and liquefying a gas in a heat exchanger that includes compressing and cooling a mixed refrigerant so that high pressure liquid and vapor streams are formed. The high pressure liquid and vapor streams are cooled in the heat exchanger and then expanded so that a primary refrigeration stream is provided in the heat exchanger. The mixed refrigerant is cooled and equilibrated between the first and last compression and cooling cycles so that a pre-cool liquid stream is formed and subcooled in the heat exchanger. The stream is then expanded and passed through the heat exchanger as a pre-cool refrigeration stream. A stream of gas is passed through the heat exchanger in countercurrent heat exchanger with the primary refrigeration stream and the pre-cool refrigeration stream so that the gas is cooled. A resulting vapor stream from the primary refrigeration stream passage and a two-phase stream from the pre-cool refrigeration stream passage exit the warm end of the exchanger and are combined and undergo a simultaneous heat and mass transfer operation prior to the first compression and cooling cycle so that a reduced temperature vapor stream is provided to the first stage compressor, so as to lower power consumption by the system.

WO2021/110052 includes a two-phase channel and considers the effects of reduced subcooling in the system. In the two-phase channel the liquid cooling liquid undergoes heat exchange where it is then converted into a "gas-liquid two-phase cooling liquid." After the heat is exchanged, the exchanged cooling liquid is output. The patent also claims high heat flow density, high heat transfer capacity, and improved temperature uniformity. A liquid-cooled plate and heat dissipation device comprising a single-phase channel and a two-phase channel are provided. First fins are spaced apart within the single-phase channel, and second fins are spaced apart within the two-phase channel. The first fins are configured to perform heat exchange with a liquid-state cooling fluid that flows through the single-phase channel, and then convert the heat exchanged liquid-state cooling fluid into a gas-liquid two-phase cooling fluid. The second fins are configured to perform heat exchange on the gas-liquid two-phase cooling fluid that flows through the two-phase channel, and then output the heat exchanged cooling fluid.

See. AU2005221080; AU2009282170; AU2009282170; AU2013313223; AU2015200871; AU2015200871; AU2015339648; AU2015339682; AU2015339685; AU2015339746; AU2015339755; AU2015339759; AU2015339773; AU2015339811; AU2015339823; AU2016340154; AU2017213536; AU2017213536; AU2019244343; AU2019294496; AU2019343158; AU2019378713; AU2020232257; AU2020232679; AU2020390566; AU2020390566; AU2021101482A4; AU2021212117; AU3437202; AU6878698; AU745437; AU771587; BE1024914; BE1024914; BE1025458; BE1025458; BR112015015845; BR112019011887; BR112020023486; BRP10610888; CA1097788; CA1115822; CA1212173; CA1249063; CA2003062C; CA2023439C; CA2042260; CA2050091C; CA2127812C; CA2288099; CA2559058; CA2731994; CA2731994C; CA2822593; CA2955273; CA3094952; CA3097913; CA3113646; CA3123450; CA3124814; CA3126846; CA3126860; CA3128868; CN101053290; CN101577353; CN101577354; CN101577354; CN101722168; CN101722168; CN102160171; CN102160171; CN102342191; CN102342191; CN102510709; CN102510709; CN103000596; CN103493351; CN104064955; CN104064955; CN104302130; CN104302130; CN104411147; CN104471508; CN104571418; CN104571418; CN104903420; CN104937067; CN105103241; CN105318211; CN105468117; CN105468117; CN105487624; CN105899040; CN105981486; CN106211705; CN106211705; CN106416450; CN106416450; CN106445037; CN106455433; CN106465561;

| CN106465561; | CN106604619; | CN106659092; | CN206674400U; | CN206674401U; | CN207590010U; |
| CN106659093; | CN106802020; | CN107079606; | CN208637788U; | CN209879081U; | CN210155613U; |
| CN107209538; | CN107484387; | CN107484387; | CN210157574U; | CN210157575U; | CN210579797U; |
| CN107765824; | CN107894823; | CN107910985; | CN210897543U; | CN210900088U; | CN210900090U; |
| CN107911995; | CN107911995; | CN107911999; | CN210986791U; | CN211202273U; | CN211926293U; |
| CN107924896; | CN107925021; | CN107977062; | CN212109192U; | CN212341825U; | CN212381592U; |
| CN107977062; | CN107979955; | CN108027632; | CN212421930U; | CN212487028U; | CN212587492U; |
| CN108073255; | CN108292151; | CN108351672; | CN212657824U; | CN212727814U; | CN212786362U; |
| CN108351673; | CN108351675; | CN108353517; | CN213028984U; | CN213028985U; | CN213093197U; |
| CN108369443; | CN108680785; | CN108811472; | CN213548106U; | CN213548141U; | CN213633918U; |
| CN108811472; | CN108901187; | CN109072054; | CN213694613U; | CN214070488U; | CN214311637U; |
| CN109074137; | CN109075370; | CN109154847; | CN214311638U; | CN214562935U; | CN214592559U; |
| CN109168306; | CN109641819; | CN109782880; | CN214751757U; | CN214751758U; | CN215264690U; |
| CN110036705; | CN110392516; | CN110413081; | CN215269221U; | CN215269313U; | CN215269314U; |
| CN110413081; | CN110470159; | CN110470159; | CN215453789U; | CN2458995Y; | DE102013217615; |
| CN110471518; | CN110475465; | CN110475465; | DE102013217615B4; | | DE102013218386; |
| CN110536584; | CN110536586; | CN110537257; | DE102015111055; | | DE102016219810; |
| CN110572992; | CN110572992; | CN110620280; | DE102016219810B4; | | DE102018006806; |
| CN110691490; | CN110691490; | CN110709373; | DE102019002614; | DE102021105997; | DE102021114012; |
| CN110716269; | CN110716269; | CN110958806; | DE112019000130T5; | DE112019004888T5; | DE1133037; |
| CN110958806; | CN110958812; | CN110958812; | DE1229555; | DE202014103329U1; | DE202018003992U1; |
| CN110996610; | CN110996610; | CN111095541; | DE4022406; | DE4022406; | DE4116960; DE60218025T2; |
| CN111095541; | CN111148407; | CN11163610; CN111163610; | DE69920842T2; | DK3162174T3; | EP0001123; EP0001123; |
| CN111176389; | CN111200916; | CN111221084; | EP0015578; | EP0033836; | EP0033836; EP0200221; |
| CN111271938; | CN111343837; | CN111356348; | EP0200221; | EP0269065; | EP0269065; EP0369827; |
| CN111356348; | CN111357299; | CN111365893; | EP0369827; | EP0403781; | EP0413498; EP0413498; |
| CN111365893; | CN111366838; | CN111366838; | EP0456508; | EP0456508A3; | EP0479205; EP0479205; |
| CN111434197; | CN111447797; | CN11447797; | EP0514840; | EP0515577; | EP0515577; EP0687385; |
| CN111465257; | CN111475002; | CN111479900; | EP0843825; | EP0843825; | EP0845680; EP0972433; |
| CN11491484; | CN11526694; | CN111615291; CN11615297; | EP0985999; | EP0985999; | EP1379825; EP1379825; |
| CN111654994; | CN111654995; | CN111726971; | EP1735054; | EP1775635; | EP1775635; EP1808060; |
| CN111736672; | CN111793475; | CN11793475; | EP2034595; | EP2176683; | EP2176683; EP2183349; |
| CN111816951; | CN111918527; | CN111995502; | EP2223811; | EP2231811; | EP2247684; EP2247684; |
| CN112004651; | CN112005619; | CN112020271; | EP2247685; | EP2287366; | EP2287366; EP2321849; |
| CN112055503; | CN112055504; | CN112071817; | EP2321849; | EP2325880; | EP2325880A3; EP2359670; |
| CN112094627; | CN112094627; | CN112105220; | EP2359670; | EP2406817; | EP2406817; EP2422594; |
| CN112106051; | CN112135811; | CN112153855; | EP2430893; | EP2475631; | EP2561271; EP2609623; |
| CN112186298; | CN112216944; | CN112216944; | EP2609623; | EP2612355; | EP2612355; EP2612356; |
| CN112240798; | CN112352029; | CN112423153; | EP2612356; | EP2645839; | EP2656496; EP2700636; |
| CN112423153; | CN112469235; | CN112469236; | EP2700636; | EP2735581; | EP2735581; EP2790311; |
| CN112496297; | CN12533443; | CN112537019; | EP2807347; | EP2809138; | EP2809138; EP2893270; |
| CN112578876; | CN112635869; | CN112650373; | EP2932349; | EP2932349; | EP2962536; EP3061131; |
| CN112684872; | CN112708398; | CN112752675; | EP3162174; | EP3162174; | EP3162175; EP3162175; |
| CN112752742; | CN112771747; | CN112795372; | EP3169935; | EP3188580; | EP3188580; EP3224918; |
| CN112795372; | CN112804854; | CN112805351; | EP3228163; | EP3229103; | EP3229573; EP3229573; |
| CN112834789; | CN112889357; | CN112902548; | EP3236726; | EP3236726; | EP3236727; EP3236727; |
| CN112940691; | CN112954980; | CN112980396; | EP3237992; | EP3237992; | EP3249496; EP3279764; |
| CN112991331; | CN112991331; | CN113056716; | EP3279765; | EP3318954; | EP3318954; EP3346491; |
| CN113056964; | CN13133272; | CN113166635; | EP3357312; | EP3362266; | EP3362266; EP3376337; |
| CN113175720; | CN113196201; | CN113260235; | EP3376337; | EP3376338; | EP3376339; EP3379374; |
| CN113272402; | CN113301764; | CN113316626; | EP3379374; | EP3379375; | EP3379376; EP3379376; |
| CN113348735; | CN113380738; | CN113382611; | EP3379377; | EP3380907; | EP3451120; EP3453235; |
| CN113396461; | CN113438857; | CN113455114; | EP3460623; | EP3460624; | EP3460625; EP3460626; |
| CN113473790; | CN113473801; | CN113518815; | EP3460627; | EP3460627; | EP3469628; EP3500546; |
| CN113544232; | CN113557283; | CN113573542; | EP3500546; | EP3541155; | EP3545732; EP3568644; |
| CN113589136; | CN113604202; | CN113614199; | EP3574523; | EP3574523; | EP3601470; EP3602621; |
| CN113614200; | CN113621352; | CN113647204; | EP3623902; | EP3624188; | EP3629691; EP3634931; |
| CN113710054; | CN113717698; | CN113717699; | EP3679603; | EP3697883; | EP3720244; EP3720244; |
| CN113755140; | CN113773812; | CN113789160; | EP3731611; | EP3768053; | EP3777491; EP3784463; |
| CN113795326; | CN113796173; | CN113835502; | EP3814446; | EP3854188; | EP3861085; EP3874923; |
| CN113853431; | CN113861949; | CN113875325; | EP3881658; | EP3887922; | EP3889820; EP3891244; |
| CN113934276; | CN113934279; | CN113939142; | EP3898878; | EP3900502; | EP3911711; EP3928603; |
| CN113939169; | CN1260944; | CN1296995C; | EP3935122; | EP3935123; | EP3935124; EP3935125; |
| CN201408823Y; | CN201408824Y; | CN202948385U; | ES2642774T3; | ES2694184T3; | ES2731728T3; |
| CN203911225U; | CN204272578U; | CN204810780U; | ES2880481T3; | FR2654518; | GB2514552; GB2528464; |
| CN204810797U; | CN206196242U; | CN206312061U; | GB2542844; | GB2543901; | GB2559180; GB2565071; |
| CN206413346U; | CN206440031U; | CN206574018U; | GB2571053; | GB2573641; | GB2582131; GB2585838; |

IL273104D0; IL275566D0; IN1998DE00795; IN2010CN00513; IN2011CN04405; IN2015DE04305; IN2015DN01748; IN201827044798; IN201917022231; IN202014044718; IN202017013387; IN202114003870; IN202117027377; IN220168; IN315844; JP2000059062; JP2001196778; JP2001333529; JP2002134798; JP2002532901; JP2003186566; JP2003523116; JP2005005529; JP2005072549; JP2005126480; JP2005237175; JP2006073944; JP2006203154; JP2006222417; JP2006229180; JP2006352146; JP2006526128; JP2007019520; JP2007110130; JP2007526110; JP2008505322; JP2008518468; JP2009060773; JP2009170550; JP2009537905; JP2010006687; JP2010089075; JP2010534271; JP2011506681; JP2011510136; JP2011510137; JP2011518395; JP2012033719; JP2012520465; JP2012525001; JP2012531056; JP2013078429; JP2013080798; JP2013208188; JP2013504655; JP2013536475; JP2013536998; JP2013536999; JP2014526106; JP2015128098; JP2015534164; JP2015536049; JP2016004911; JP2016029796; JP2016029796A5; JP2016046431; JP2016111698; JP2016509278; JP2016519419; JP2016533640; JP2016533652; JP2016539503; JP2017050548; JP2017163065; JP2017183344; JP2017191431; JP2017215831; JP2017520832; JP2017522650; JP2018010980; JP2018011001; JP2018018857; JP2018049582; JP2018049617; JP2018060884; JP2018088433; JP2018117039; JP2018124978; JP2018125363; JP2018129408; JP2018537000; JP2019012470; JP2019021766; JP2019061439; JP2019096293; JP2019200632; JP2019535642; JP2019537152; JP2020024617; JP2020065002; JP2020123653; JP2020136335; JP2020140485; JP2020145371; JP2020176804; JP2020205025; JP2020507212; JP2020514420; JP2020515409; JP2020527613; JP2020532875; JP2020534701; JP2021018251; JP2021035319; JP2021077357; JP2021090010; JP2021111660; JP2021117574; JP2021136093; JP2021162195; JP2021196816; JP2021197461; JP2021501950; JP2021501951; JP2021507512; JP2021519978; JP2021522383; JP2021523196; JP2021529853; JP2022501729; JP2022502414; JP2669924; JP2677275; JP2690585; JP2776994; JP2882706; JP2919036; JP3024860; JP3163213U; JP3315649; JP3320070; JP3741864; JP3842759; JP3930210; JP4284253; JP4398956; JP4409729; JP4463411; JP4519823; JP4568253; JP4740362; JP4903295; JP4903729; JP5586634; JP5626593; JP5681710; JP5853072; JP5882326; JP5889509; JP5956097; JP5956098; JP5956099; JP5956100; JP5996648; JP6000951; JP6000952; JP6038079; JP6064083; JP6127216; JP6127217; JP6127218; JP6158700; JP6217835; JP6218098; JP6228228; JP6237942; JP6244066; JP6244067; JP6278053; JP6278071; JP6293152; JP6346283; JP6399049; JP6442066; JP6494772; JP6494773; JP6523469; JP6523469B6; JP6523470; JP6523470B6; JP6524374; JP6534386; JP6581603; JP6644906; JP6644907; JP6644908; JP6644909; JP6658312; JP6687416; JP6720752; JP6790690; JP6790855; JP6850336; JP6866816; JP6875422; JP6877165; JP6907316; JP6971253; JP6980969; JPH02152262; JPF10236047U; JPH05136305; JPH05160313; JPH05326780; JPH06104357; JPH0648867Y2; JPH0719157Y2; JPH0727997; JPH0732317; JPH07336077; JP-1073847; JPH0831997; JP-1086085; JPH10510682; JPWO2016075838; JPWO2016088280; JPWO2016117098; JPWO2016157396; JPWO2016157397; JPWO2017002270; JPWO2017037860; JPWO2017081778; JPWO2017081779; JPWO2017081780; JPWO2017187644; JPWO2017199315; JPWO2017199316; JPWO2017199317; JPWO2017199318; JPWO2018087902; JPWO2018087903; JPWO2018087904; JPWO2018087905; JPWO2018207305; JPWO2018207306; KR100281500; KR100320984; KR100402788; KR100505279; KR100505554; KR100794747; KR100819485; KR101089432; KR101115711; KR101131091; KR101205715; KR101238417; KR101240250; KR101437702; KR101506061; KR101641399; KR101657829; KR101719821; KR101807743; KR101831275; KR101853754; KR101914493; KR101920706; KR102106037; KR102127188; KR102137294; KR102174120; KR102204808; KR102206706; KR102230573; KR102230578; KR102246201; KR102288462; KR19980024121; KR19990036249; KR20010093818; KR20020072344; KR20030035569; KR20040067701; KR20040103151; KR20050013402; KR20060021694; KR20060044080; KR20060115145; KR20070040744; KR20070044786; KR20070084584; KR20080021697; KR20090024642; KR20100019975; KR20100032347; KR20100043068; KR20100045365; KR20100045366; KR20100045367; KR20100045376; KR20100053429; KR20100106389; KR20100112618; KR20100131431; KR20110128539; KR20110134469; KR20120016102; KR20120021130; KR20120024292; KR20120048542; KR20120048543; KR20120062892; KR20130094805; KR20130105819; KR20130136446; KR20140094064; KR20150060894; KR20150109368; KR20150109369; KR20150129813; KR20160074494; KR20160078674; KR20160116438; KR20170039194; KR20170069956; KR20180075137; KR20190040979; KR20190060659; KR20190091896; KR20190110514; KR20190110515; KR20190132190; KR20190133156; KR20200016881; KR20200037174; KR20200037175; KR20200051669; KR20200096927; KR20210005033; KR20210010868; KR20210022609; KR20210022610; KR20210023937; KR20210023938; KR20210023941; KR20210023943; KR20210024517; KR20210024990; KR20210025607; KR20210065967; KR20210082239; KR20210104820; KR20210110876; KR20210119384; KR20210130542; KR20210134008; KR20210134009; KR20210141957; KR910020864; KR920007519; KR940000206; KR950002271; NL2015841; PL229619; Publication Number; RU156137U1; RU181944U1; RU2013129837; RU2052884C1; RU2066518C1; RU2496134C1; RU2500012C1; RU2500013C1; RU2559825; RU2609915; RU2621360C1; RU2632400C1; RU2643173C1; RU2657341C1; RU2683425C1; RU2692569C1; RU2695089; RU2696256; RU2706511C1; SU1751830; TW200806098; TW200821799; TW200821809; TW200827998; TW200931772; TW200950687; TW201007110; TW201018381; TW20115097; TW201115102; TW201210439; TW201215308; TW201220464; TW201230215; TW201230289; TW201234501; TW201442306; TW201608195; TW201626148; TW201633881; TW201821938; TW201840808; TW201905160; TW201921225; TW201924134; TW201925717; TW201925718; TW201927117; TW201927120; TW201927999; TW201941487; TW202003458;

TW202004408; TW202018243; TW202020385; TW202020389; TW202021957; TW202022303; TW202022549; TW202023353; TW202029875; TW202041821; TW202045882; TW202046469; TW202046853; TW202100930; TW202101161; TW202102101; TW202104148; TW202110522; TW202111271; TW202112214; TW202112724; TW202116394; TW202120878; TW202129231; TW202130259; TW202132251; TW202134821; TW202136187; TW202137854; TW202139385; TW202147973; TW492040; TW518775; TWI247334; TWI344671; TWI375006; TWI388971; TWI424308; TWI468910; TWI488562; TWI517353; TWI520305; TWI527132; TWI556334; TWI559843; TWI600870; TWI606328; TWI635250; TWI654920; TWI659188; TWI675997; TWI677663; TWI678961; TWI686127; TWI690686; TWI696416; TWI703690; TWI706118; TWI710883; TWI715074; TWI724541; TWI742569; TWI747628; TWI747629; TWI750487; TWI750733; TWI751804; TWM604539U; TWM610267U; TWM616682U; TWM616684U; TWM617268U; TWM618811U; TWM619768U; U.S. Pat. Nos. 10,015,905; 10,015,912; 10,018,425; 10,020,436; 10,064,313; 10,070,560; 10,080,308; 1,008,249; 111,367; 10,123,453; 10,123,454; 10,123,463; 10,130,008; 10,143,113; 10,149,408; 10,156,873; 10,184,699; 10,194,559; 10,204,659; 10,212,849; 10,225,951; 10,240,845; 10,251,318; 10,257,960; 10,257,963; 10,271,464; 10,285,309; 10,306,799; 10,321,609; 10,334,763; 10,349,555; 10,356,958; 10,399,190; 10,401,924; 10,405,457; 10,420,251; 10,424,531; 10,477,726; 10,481,650; 10,512,192; 1,051,791; 10,524,387; 10,528,094; 10,528,096; 10,542,640; 10,560,765; 10,568,234; 10,575,437; 10,606,326; 10,617,032; 10,624,237; 10,638,641; 10,653,036; 10,653,043; 10,660,239; 10,662,359; 10,667,427; 10,667,434; 10,674,637; 10,694,643; 10,716,238; 10,736,240; 10,750,637; 10,765,033; 10,775,858; 10,779,442; 10,791,647; 10,809,775; 10,813,254; 10,820,446; 10,820,447; 10,862,583; 10,881,020; 10,888,031; 10,888,032; 10,916,487; 10,920,753; 10,925,180; 10,925,188; 10,932,390; 10,939,580; 10,939,589; 10,944,202; 10,945,352; 10,955,884; 10,962,300; 10,962,588; 10,966,349; 10,969,842; 10,985,089; 10,985,537; 10,990,144; 11,006,547; 11,100,9653; 1,009,925; 11,013,143; 11,013,144; 11,023,021; 11,032,941; 11,039,552; 11,044,141; 11,051,426; 11,058,029; 11,064,634; 11,071,232; 11,071,238; 1,076,508; 11,083,110; 11,096,313; 11,096,315; 11,101,630; 11,102,912; 11,116,106; 11,116,113; 11,124,744; 11,129,298; 11,130,277; 11,134,586; 11,157,050; 11,169,582; 11,172,593; 11,184,997; 11,188,214; 11,219,142; 11,224,144; US20010037716; US20020003432; US20020021557; US20020112491; US20020124995; US20020135389; US20020179284; US20030038688; US20030080413; US20030151883; US20030177774; US20040004435; US20040052280; US20040118142; US20040165628; US20060001435; US20060080819; US20060090881; US20060230769; US20070082280; US20070090853; US20070193285; US20070193721; US20070227710; US20070276455; US20080151541; US20080174955; US20080219007; US20090014158; US20090029890; US20090055114; US20090055115; US20090058199; US20090079453; US20090186799; US20090186800; US20100101759; US20100101765; US20100103614; US20100103618; US20100103620; US20100118494; US20100188082; US20100200797; US20100231250; US20100263885; US20100326628; US20100328882; US20100328889; US20100328890; US20100328891; US20110065620; US20110069453; US20110075373; US20110077161; US20110103019; US20110122583; US20110132579; US20110212410; US20110315343; US20110315344; US20110315353; US20110315355; US20110317367; US20120024501; US20120026691; US20120049376; US20120051695; US20120056327; US20120090825; US20120111027; US20120111034; US20120111035; US20120111036; US20120210731; US20120211878; US20120243169; US20120286192; US20120320527; US20130015578; US20130019614; US20130021746; US20130021752; US20130068423; US20130068441; US20130081258; US20130091866; US20130091868; US20130105120; US20130105122; US20130139998; US20130180687; US20130296978; US20140055156; US20140060798; US20140060799; US20140068942; US20140071626; US20140071627; US20140082942; US20140085817; US20140085822; US20140085823; US20140107350; US20140121293; US20140123492; US20140123493; US20140124167; US20140124174; US20140133096; US20140133099; US20140146467; US20140146468; US20140183957; US20140216686; US20140216688; US20140216711; US20140218858; US20140218859; US20140218861; US20140263976; US20140270731; US20140307360; US20140355204; US20140355212; US20150000319; US20150013940; US2015013960; US20150022975; US20150025601; US20150043165; US20150049432; US20150060009; US20150061712; US20150062806; US20150070846; US20150108615; US20150109728; US20150109729; US20150109730; US20150109735; US20150138723; US20150181762; US20150189796; US20150192368; US20150195953; US20150197501; US20150208549; US20150230366; US20150233619; US20150237767; US20150257303; US20150351281; US20150351290; US20150359132; US20150382511; US20150382515; US20160014932; US20160044824; US20160044833; US20160102880; US20160113149; US20160113150; US20160116224; US20160118317; US20160120019; US20160120058; US20160120059; US20160120064; US20160120065; US20160120071; US20160123637; US20160128238; US20160209865; US20160222168; US20160234970; US20160240226; US20160242319; US20160242326; US20160286685; US20160286694; US20160349810; US20160349811; US20160366792; US20170013744; US20170064862; US20170071079; US20170105313; US20170127565; US20170127576; US20170156233; US20170167712; US20170177041; US20170215299; US20170223870; US20170265328; US20170269651; US20170271843; US20170273223; US20170280587; US20170290198; US20170295676; US20170303443; US20170311479; US20170311484; US20170325358; US20170332514; US20170354061; US20170354066; US20170358556; US20180020570; US20180020571; US20180020572; US20180027696; US20180070477; US20180084670; US20180084671; US20180084676; US20180084677; US20180084678; US20180092243; US20180098464; US20180132386; US20180153058; US20180196484; US20180219002; US20180246550; US20180288906; US20180304537; US20180317346; US20180343770; US20180356866; US20180363993; US20180363994; US20180376615; US20190008077; US20190037732; US20190045661; US20190082556; US20190098796; US20190119609; US20190141861; US20190150323; US20190150324; US20190150325; US20190150326; US20190159359; US20190166726; US20190179382; US20190196557; US20190200482; US20190208664;

US20190219311; US20190223324; US20190235591; US20190246518; US20190289748; US20190294220; US20190294221; US20190297747; US20190317570; US20190333840; US20190335252; US20190338962; US20190357384; US20190357385; US20190364699; US20190374105; US20200002589; US20200006197; US20200015383; US20200022289; US2020025451; US2020089293; US20200091686; US20200093024; US20200093025; US20200093026; US20200093032; US20200093037; US2020093038; US20200113083; US20200120831; US20200132388; US2020145099; US20200150731; US20200158443; US20200178414; US20200199427; US20200205318; US20200253086; US20200257342; US20200258810; US20200260613; US20200267872; US20200281093; US20200288600; US20200288601; US20200305307; US20200305310; US20200315059; US20200318861; US20200323100; US20200323108; US20200323109; US20200328139; US20200329551; US20200370845; US20200371569; US20200375059; US20200379164; US20200386488; US20200389997; US20200390007; US20200393206; US20200409435; US20210007244; US20210014105; US20210018356; US20210022263; US20210057787; US20210059079; US20210075148; US20210102294; US20210103320; US20210104788; US20210112683; US20210120705; US20210122962; US20210125899; US20210126304; US20210139441; US20210144885; US20210148608; US20210148643; US20210153392; US20210166991; US20210176897; US20210176898; US20210185850; US20210204451; US20210219463; US20210221776; US20210234343; US20210239927; US20210246886; US20210270252; US20210274677; US20210274687; US20210276410; US20210281149; US20210284892; US20210285728; US20210289659; US20210289662; US20210298198; US20210302074; US20210303145; US20210321526; US20210321534; US20210321535; US20210321542; US20210327787; US20210333846; US20210337704; US20210340421; US20210344255; US20210348044; US20210348624; US20210351106; US20210351108; US20210356180; US20210357346; US20210368647; US20210368655; US20210378140; US20210378148; US20210382533; US20210385971; US20210385974; US20210392776; US20210395213; US20210400813; US20210410292; US20210410317; US20210410319; US20210410320; US20210410328; US20210410329; US20210410337; US20220003433; US20220004475; US20220007548; US20220011834; US20220011835; US20220015266; U.S. Pat. Nos. 4,138,692; 4,203,129; 4,233,645; 4,263,965; 4,474,231; 4,590,538; 4,704,658; 4,765,397; 4,941,530; 4,944,344; 4,970,868; 4,987,478; 5,004,973; 5,021,924; 5,038,571; 5,099,908; 5,103,557; 5,119,021; 5,131,233; 5,168,348; 5,180,001; 5,225,771; 5,271,455; 5,297,621; 5,300,810; 5,349,499; 5,451,489; 5,463,872; 5,469,711; 5,495,490; 5,544,696; 5,552,635; 5,585,772; 5,600,257; 5,629,137; 5,647,429; 5,654,127; 5,725,995; 5,814,392; 5,907,473; 5,920,457; 5,929,651; 6,065,208; 6,111,749; 6,139,361; 6,193,905; 6,351,134; 6,404,640; 6,443,222; 6,552,560; 6,595,014; 6,621,707; 6,700,458; 6,724,792; 6,744,136; 6,772,603; 6,817,196; 6,882,156; 7,145,927; 7,285,851; 7,375,542; 7,462,429; 7,462,430; 7,556,086; 7,625,854; 7,629,307; 7,663,389; 7,710,538; 7,710,539; 7,724,524; 7,760,497; 7,767,635; 7,784,972; 7,800,258; 7,819,556; 7,885,070; 7,885,074; 7,907,406; 7,916,483; 7,921,853; 7,944,694; 7,961,475; 7,983,040; 8,014,150; 8,018,720; 8,059,405; 8,066,900; 8,094,454; 8,179,677; 8,184,436; 8,194,406; 8,203,842; 8,232,235; 8,248,801; 8,280,468; 8,283,766; 8,289,039; 8,290,319; 8,345,423; 8,351,206; 8,369,091; 8,373,280; 8,378,677; 8,390,109; 8,472,182; 8,490,679; 8,619,425; 8,713,957; 8,720,219; 8,724,322; 8,739,406; 8,772,920; 8,783,052; 8,789,385; 8,806,749; 8,813,515; 8,833,096; 8,834,739; 8,867,209; 8,929,080; 8,934,250; 8,941,994; 8,947,873; 8,953,317; 8,953,320; 8,955,346; 8,955,347; 8,959,941; 8,964,390; 8,964,391; 8,966,922; 9,009,971; 9,042,098; 9,042,099; 9,049,800; 9,051,293; 9,081,054; 9,095,942; 9,101,078; 9,144,179; 9,195,282; 9,209,165; 9,210,830; 9,250,024; 9,261,308; 9,282,678; 9,303,926; 9,304,533; 9,313,920; 9,328,964; 9,332,674; 9,334,371; 9,335,367; 9,335,802; 9,351,429; 9,357,675; 9,359,324; 9,414,520; 9,433,132; 9,459,280; 9,464,854; 9,471,089; 9,510,486; 9,516,792; 9,543,787; 9,593,876; 9,622,379; 9,655,283; 9,686,889; 9,713,290; 9,738,757; 9,750,159; 9,773,526; 9,832,913; 9,844,166; 9,848,509; 9,852,963; 9,854,713; 9,854,714; 9,854,715; 9,861,012; 9,861,013; 9,872,415; 9,893,679; 9,901,008; 9,901,013; 9,907,213; 9,918,409; 9,921,622; 9,936,606; 9,945,576; 9,960,150; 9,974,208; 9,992,914; WO1990005380; WO199008400; WO1991012706; WO1992015832; WO1994020992; WO1995025603; WO1997006444; WO1998046058; WO2001047631; WO2001059804; WO2002023115; WO2002081996; WO2004025797; WO2005086846; WO2006005031; WO2006031824; WO2006049768; WO2007098477; WO2008024785; WO2008042129; WO2009004521; WO2009009516; WO2009014877; WO2009079201; WO2009091644; WO2009091761; WO2009145149; WO2010019517; WO2010032965; WO2010046151; WO2010104990; WO2010123671; WO2010141482; WO2010149536; WO2011031581; WO2011149216; WO2012027081; WO2012030469; WO2012030470; WO2012087869; WO2012154372; WO2013051254; WO2013102220; WO2013145933; WO2014007672; WO2014007673; WO2014039212; WO2014071985; WO2014109869; WO2014120275; WO2014120276; WO2014163829; WO2015010039; WO2015060978; WO2015183265; WO2016003778; WO2016003779; WO2016009089; WO2016031781; WO2016053260; WO2016068834; WO2016069259; WO2016069271; WO2016069285; WO2016069295; WO2016069299; WO2016069313; WO2016069380; WO2016069414; WO2016069417; WO2016075838; WO2016076882; WO2016085965; WO2016088280; WO2016091133; WO2016117098; WO2016153488; WO2016157396; WO2016157397; WO2017002270; WO2017037860; WO2017040217; WO2017055877; WO2017066727; WO2017070867; WO2017081778; WO2017081779; WO2017081780; WO2017089313; WO2017135992; WO2017187644; WO2017199315; WO2017199316; WO2017199317; WO2017199318; WO2017218290; WO2018025016; WO2018039096; WO2018072369; WO2018076646; WO2018087902; WO2018087903; WO2018087904; WO2018087905; WO2018096362; WO2018130627; WO2018135327; WO2018138532; WO2018138532A9; WO2018165623; WO2018172919; WO2018178745; WO2018195884; WO2018195885; WO2018207305; WO2018207306; WO2018224908; WO2019006437; WO2019015321; WO2019027343; WO2019048864; WO2019079803; WO2019096090; WO2019116260; WO2019132696; WO2019146180; WO2019146212; WO2019146724; WO2019186092; WO2019207484; WO2019209451; WO2019220293; WO2020005911; WO2020061305; WO2020065492; WO2020066907; WO2020072731; WO2020084426; WO2020091690; WO2020102090; WO2020102239;

WO2020109937; WO2020115602; WO2020127666; WO2020127771; WO2020132307; WO2020132335; WO2020150437; WO2020170079; WO2020180828; WO2020180834; WO2020180839; WO2020180840; WO2020187839; WO2020190434; WO2020195301; WO2020197632; WO2020200523; WO2020209903; WO2020216954; WO2020225649; WO2020234600; WO2020236317; WO2020250104; WO2020254917; WO2021008949; WO2021008993; WO2021040841; WO2021041167; WO2021041169; WO2021048785; WO2021058880; WO2021064566; WO2021080660; WO2021086804; WO2021096820; WO2021096858; WO2021099768; WO2021099770; WO2021102517; WO2021111296; WO2021111960; WO2021119078; WO2021119375; WO2021119390; WO2021137137; WO2021142431; WO2021144678; WO2021159202; WO2021173833; WO2021176910; WO2021184084; WO2021190403; WO2021211682; WO2021212425; WO2021231620; WO2021236428; WO2021241919; WO2021247920; WO2021263037; WO2022005556; WO2022010708; and WO2022010745, each of which is expressly incorporated herein by reference.

SUMMARY OF THE INVENTION

The present technology improves phase change cooling technology by providing a heat exchanger to reduce the subcooling of the phase change refrigerant entering the evaporator, e.g., ahead of the first server in the rack cooling loop, to capture heat from the efflux of the evaporator or evaporator loop to alter the operating point of the evaporator to one with less subcooling. This heat exchanger cools the refrigerant from the return coming from the heat exchanger, which may be a liquid, gas or liquid-gas mixture, thus increasing its density.

As a result of warming the incoming refrigerant, the heat capacity of the system and thermodynamic efficiency as a whole (including condenser) is likely reduced. However, when considering the efficiency of evaporators subject to high subcooling, and performance of the system for its intended purpose of cooling the servers, the result is improved heat transfer coefficient. The present technology thus proposes to likely compromise system efficiency for the sake of improved evaporator performance.

The subcooling of the refrigerant is dependent on its pressure, which depends on height. In a typical datacenter application, servers are mounted in racks, which have a height which ranges over about 2 meters. At a density of about 1.7 gm/cm$^3$, that means that the pressure at the bottom is 340 gm/cm$^2$ (~5 psi) greater at the bottom than the top. Therefore, assuming isothermal conditions in the inlet conduit, which would be expected without phase change or significant heat transfer through the conduit, the servers at the bottom of the rack would have greater subcooling than the servers at the top.

Note that more complex control systems may be implemented, though an advantage of the technology is that in some embodiments, sophisticated control is not required.

The present technology may be "passively" controlled to achieve a low degree of subcooling at each server.

In principle, the warm refrigerant from the exhaust of the evaporator loop is at a temperature below the boiling point of the cool refrigerant at the pump, because the outlet of the pump has the highest pressure in the system, and the exhaust the lowest, and the exhaust refrigerant from the evaporator loop is saturated with some liquid remaining. The cool refrigerant at the inlet is at a higher pressure than the warm refrigerant, and the warm refrigerant remains a mix of liquid and gas. Therefore, the passive heat exchanger operating on the exhaust of the evaporator cannot achieve a saturation condition of the refrigerant entering the evaporator loop. Note that this is the desired state, but it also means that there is limited heat energy available to control the system.

Sensing the amount of subcool may be achieved with an electronic control 70 system that measures temperatures and pressures, which can then electronically control the system such as by adjusting a bypass valve 72 in the manifold 36.

A mechanical or electronic regulator system may also be provided to control the flow of refrigerant in the evaporator loop, to maintain a desired level of subcool. An electronic regulator measures thermodynamic properties of the incoming liquid refrigerant and the refrigerant in the first evaporator, and calculates the subcool, and on that basis generates a control signal to control a flow rate through the heat exchanger. For example, a proportion of the exhaust stream which passes through the heat exchanger may be varied to maintain a setpoint. A mechanical regulator system dependent on incoming refrigerant temperature and pressure, and using heat and pressure differential from the exhaust, may also be implemented to control the heat exchanger.

An alternate mechanical regulator employs an isolated sample of a different surrogate refrigerant that has a consistent relationship to the operating refrigerant with e.g., a 2-5° C. lower boiling point over the range of operating conditions. Therefore, if at the incoming pressure and temperature of the refrigerant, the surrogate refrigerant evaporates, the volumetric change and accompanying pressure increase in the isolated surrogate refrigerant due to the vapor generation (such as in an accordion expansion chamber) drives an actuator as a control 70 which controls a valve 62, 64 in each heat exchanger, which in turn controls the heat transfer from the output of the evaporator loop to the incoming refrigerant entering the heat exchanger. For example, the valve 62, 64 may modulate a portion of the flow from the evaporator loop passing through the heat exchanger to warm the incoming refrigerant, or modulate the flow of cool refrigerant from the condenser into the heat exchanger, or both. The target is therefore to establish a negative feedback loop with maintains the evaporator at the threshold of boiling of the surrogate refrigerant, which corresponds to a 2-5° C. subcool for the cool refrigerant, maintained over a range of operating conditions. For example, the operating refrigerant may be 3M FC-72 (BP 56° C.) and the surrogate refrigerant FC-3284 (BP 50° C.).

A thermally responsive element, such as a pair of opposing bimetal actuators, may also provide a control signal dependent on the temperature difference between the inlet and outlet of the evaporator loop. The outlet of the evaporator loop will tend to be at a saturation temperature of the refrigerant (at its operating pressure), and thus the thermal regulator may regulate a subcool temperature at the inlet of the first evaporator to remain, e.g., at 5-8 degrees C. Note that the desired regulation is to limit the subcool at the first evaporator, while assuring sufficient flow of refrigerant not to starve the last evaporator. When measuring the temperature increase across the entire set of evaporators, the temperature different will be greater than the subcool for the first evaporator, explaining the increased temperature difference.

Therefore, an operating point is established in the heat exchanger using feedback to maintain a reasonably steady cavitation state, for example, to control the flow rate of cold refrigerant into the cooling loop. As the flow rate drops too low, the warming of the cool refrigerant will exceed an optimum amount, and the cavitation will increase, also indicative of insufficient refrigerant flow in the loop to cool the equipment. As the flow rate exceeds an optimum amount, the warming of the cool refrigerant in the heat exchanger will be insufficient, and the subcool of the refrigerant entering the evaporator will be greater than optimal. Instead of directly controlling flow of the cold refrigerant into the heat exchanger, the valve can also control a bypass proportion of refrigerant in the manifold.

The heat exchanger cools the fluid exiting from the evaporator, thereby increasing its density, e.g., by condensing some gas into fluid. The increase in density of fluid in the return has a complex effect of system efficiency. On one hand, a hotter return gas mix would be more efficient in the condenser, though in a pure gas or azeotropic mix, the temperature may be constant. A higher density mix may be more efficiently transported, with lower losses due to flow restrictions. This heat transfer from liquid at the outlet to the inlet fluid reduces the vapor content returning to the condenser which can improve stability of the loop.

Therefore, the present technology intentionally compromises the net (maximum) cooling capacity of the incoming stream of subcooled cooling fluid, in favor of increased efficiency of the evaporators in the cooling loop, which can then be designed to operate efficiently in a phase transition regime, with reduced concern for the possibility that the evaporator may be tasked with operating as a liquid cooling heatsink without phase change.

The technology uses a preheater heat exchanger to reduce subcooling of a phase change coolant prior to entering an evaporator to improve heat transfer performance of the evaporator(s). This is preferably accomplished by utilizing the available heat in the coolant exiting the evaporators to decrease the degree of subcooling of the supplied coolant to the evaporators. Heat is transferred from the hot coolant exiting the evaporator loop to the subcooled liquid entering the evaporator loop. This allows for a reduction in the degree of subcooling at the evaporator inlet, yielding a higher heat transfer coefficient within the evaporator. Preferably, the coolant entering the evaporator from the heat exchanger is slightly subcooled, though this is not required, and refrigerant passing from a preceding evaporator to a succeeding evaporator may not be subcooled.

Another advantage of the heat exchanger is a reduction in the backpressure in evaporators that is created due to vapor generation.

Using this technology helps reduce subcooling in two-phase cooling evaporators and does not require any external heat source or secondary controlling of the heat added to the coolant. The operating point of the evaporator is thus altered toward a low-subcool inlet and efficient phase change operational regime. An uncontrolled process, or simple thermostatic or pressure-based control may be used as desired. Of course, various automated control systems may be employed as well.

Although an uncontrolled version of this technology does not allow for precise control of the degree of subcooling, there is less energy consumption overall due to the lack of a designated heater.

It is therefore an object to provide a manifold for a phase change refrigerant cooling system, comprising: an inlet port configured to receive a flow of at least a liquid phase change refrigerant; an outlet port configured to output a flow of at least warmed phase change refrigerant; a cold conduit configured to distribute the at least liquid phase change refrigerant from the inlet port to a plurality of cooling loops; a hot conduit configured to receive the warmed phase change refrigerant from the plurality of cooling loops, and convey it to the outlet port; and a plurality of heat exchangers, each being configured to transfer heat from the warmed phase change refrigerant from the plurality of cooling loops to the at least liquid phase change refrigerant from the inlet port, whereby a subcooling of the at least liquid phase change refrigerant is reduced.

It is also an object to provide a phase change refrigerant cooling system, comprising: an inlet port configured to receive a flow of at least a liquid phase change refrigerant; an outlet port configured to output a flow of warmed phase change refrigerant; a cold conduit configured to distribute the at least liquid phase change refrigerant from the inlet port to at least one evaporator; a hot conduit configured to receive the warmed phase change refrigerant from the at least one evaporator; and a heat exchanger, configured to transfer heat from the warmed phase change refrigerant to the at least liquid phase change refrigerant, whereby a subcooling of the at least liquid phase change refrigerant is reduced.

It is also an object to provide a heat exchanger for a phase change refrigerant cooled electronic system, comprising: an inlet port configured to receive a flow of at least a liquid phase change refrigerant; an outlet port configured to output a flow of warmed phase change refrigerant; a heat exchanger, configured to transfer heat from the warmed phase change refrigerant to the at least liquid refrigerant, whereby a subcooling of the at least liquid phase change refrigerant is reduced; an interface cold port configured to supply the at least a liquid phase change refrigerant with reduced subcooling to an evaporator; and an interface hot port configured to receive the warmed phase change refrigerant from the evaporator.

Another object provides a method for cooling an information technology system, comprising: receiving a flow of a subcooled liquid phase change refrigerant; cooling the information technology system by sensible heat transfer in an evaporator with the phase change refrigerant, to warm the phase change refrigerant; and exchanging heat from the warmed phase change refrigerant from the evaporator to the subcooled liquid refrigerant.

The system may be controlled in dependence on a subcool condition of refrigerant entering the evaporator, or sensing of a cavitation of refrigerant, for example in a portion of the heat exchanger isolated from another portion of the heat exchanger, so that the sensing portion has lower subcooling than the remaining portion.

The exchanging of heat from the at least gaseous refrigerant from the evaporator to the subcooled phase change refrigerant may be controlled to maintain at least a portion of liquid refrigerant in the at least gaseous refrigerant.

DETAILED DESCRIPTION OF THE PREFERRED EMBODIMENTS

Figure 1:
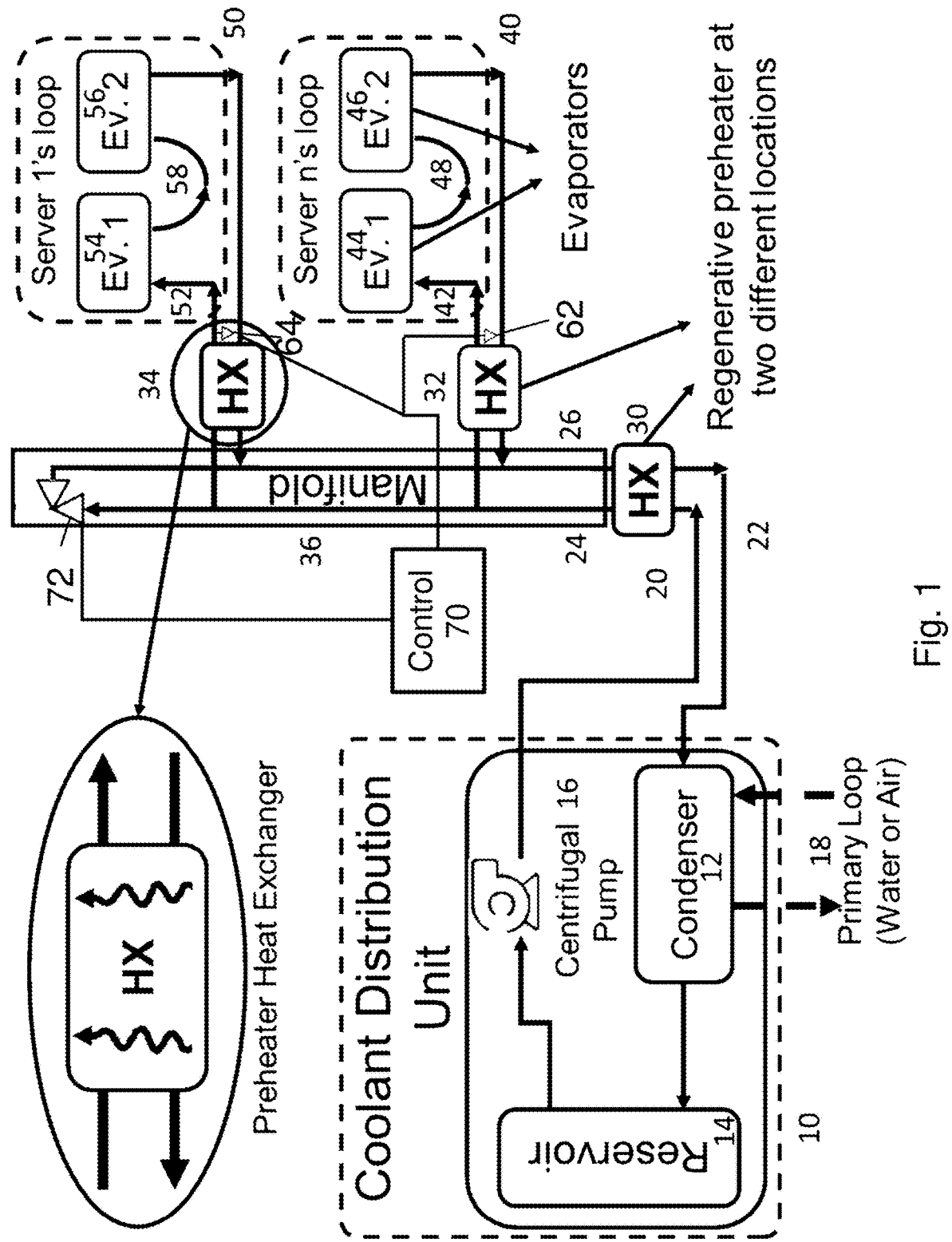
FIG. 1 shows a schematic diagram of an embodiment of the present invention.

As shown in FIG. 1, the system includes three main parts, servers 40. 50, a coolant distribution unit (CDU) 10, and a manifold 36. There could be other configurations of the CDU, e.g., there can be no reservoir, the location of reservoir can be different, the pump can be a gear pump, etc.

The servers are deployed on a rack. Each server hosts multiple central processing units (CPU), and each CPU is associated with a phase change cooler (evaporator) 44, 46, 54, 56.

The CDU 10 is deployed at the bottom of the rack (i.e., at the highest gravity-induced pressure) and is responsible for supplying the coolant (e.g., Novec/HFE-7000 or another refrigerant or phase change fluid) to the manifold 36 via a centrifugal pump 16 and transferring the absorbed heat in the secondary loop returned by line 22, and fed with line 20, by the coolant to a chilled water loop 18 from the building (primary loop) through a heat exchanger (HX) 30.

As shown in FIG. 1 The CDU 10 has a pump 16 (which may also be centrifugal or a gear pump or other type of pump), which draws refrigerant from a reservoir 14, to feed a manifold 36 through line 20. The manifold provides a cold line 24, which distributes liquid refrigerant to the various servers. The hot line 26 returns gaseous refrigerant and often some liquid to the condenser 12, which as a cold water loop 18 for cooling the refrigerant. The cooled refrigerant is accumulated in the reservoir 14. The cold water loop 18 cools the refrigerant to e.g., 30° C., dependent on the operating pressure and phase change refrigerant employed. Ideally, the fluid is cooled to just below the corresponding saturation temperature of the refrigerant in the condenser. Other configurations are of course possible.

Each server receives a flow of refrigerant from the cold line 24 of the manifold 36 and returns gaseous refrigerant and often some liquid to the hot line 26 of the manifold 36.

A heat exchanger 32, 34 is provided for each server 40, 50 loop, and optionally a heat exchanger 30 is provided at the entry to the manifold 36. The heat exchanger 32, 34 may be an integral part of the manifold, e.g., specifically designed to facilitate heat transfer from the hot line 26 to the cold line 24.

The heat exchanger 30, when provided, reduces the subcooling of the refrigerant. Subcooling is the number of degrees below the boiling point a volatile fluid is in. That is, the fluid in the reservoir 14 is below the boiling point of the refrigerant, e.g., Novac 7000, and as delivered to the cold line 24 is below the fluid boiling point. By transferring heat from the hot line 26 to the cold line 24, the cold line 24, the refrigerant entering the server 40, 50 loop is closer to its boiling point. Likewise, the heat exchangers 32, 34 heat the cold refrigerant entering the server loop 40, 50 in line 42, 52, with heat from the evaporators 44, 46, 54, 56 to further reduce the subcooling.

Figure 2:
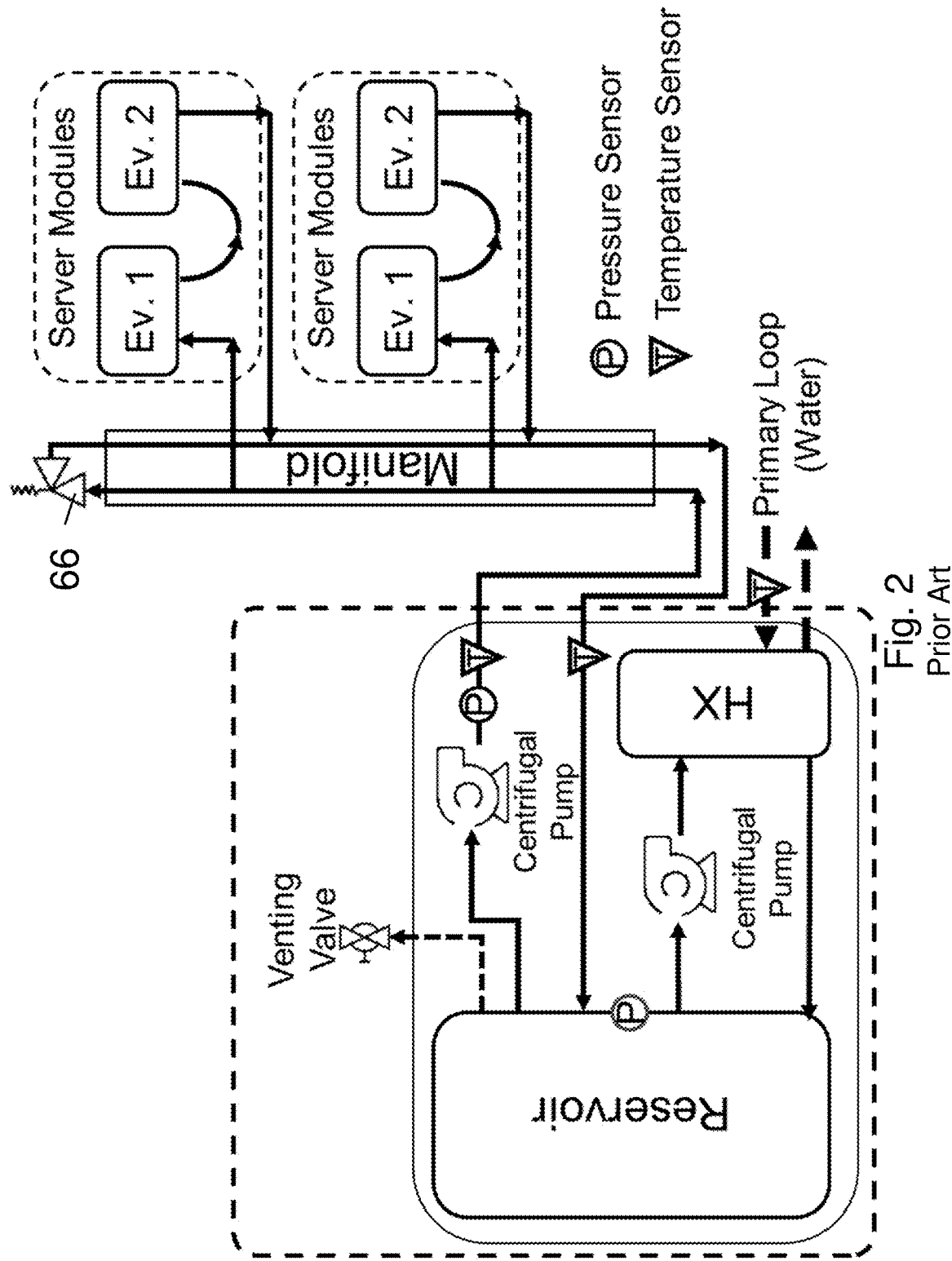
FIG. 2 shows a prior art schematic of components of the rack scale cooling system and the relative location of the instrumentation.

Therefore, the evaporators, and especially the initial evaporators in the server loop 44, 54, transfer a smaller portion of heat through sensible heat transfer, and a higher portion through latent heat transfer, than a corresponding system, e.g., as shown in FIG. 2, which does not have the heat exchangers. Because the heat exchangers 32, 34 as shown in FIG. 1 are proximate to the evaporators 44, 46, 54, 56, and thus the lines 20 and 22 are cooler and hold a more dense fluid or fluid-gas mixture than if the heat exchangers were displaced from the evaporators, or for example, the CDU 10 run with less subcooling. This arrangement compensates for gravitational and line pressure drop induced changes in subcool degree, and ensures that the feed line 20 entering the manifold is a cool liquid.

In another embodiment, the heat exchangers 32, 34 are replaced with thermoelectric heat pumps, which, though dissipative, are more controllable and potentially allow thermodynamically unfavorable heat transfer.

FIG. 2 shows a prior art phase change cooling system which lacks heat exchangers associated with the evaporators.

Figure 3:
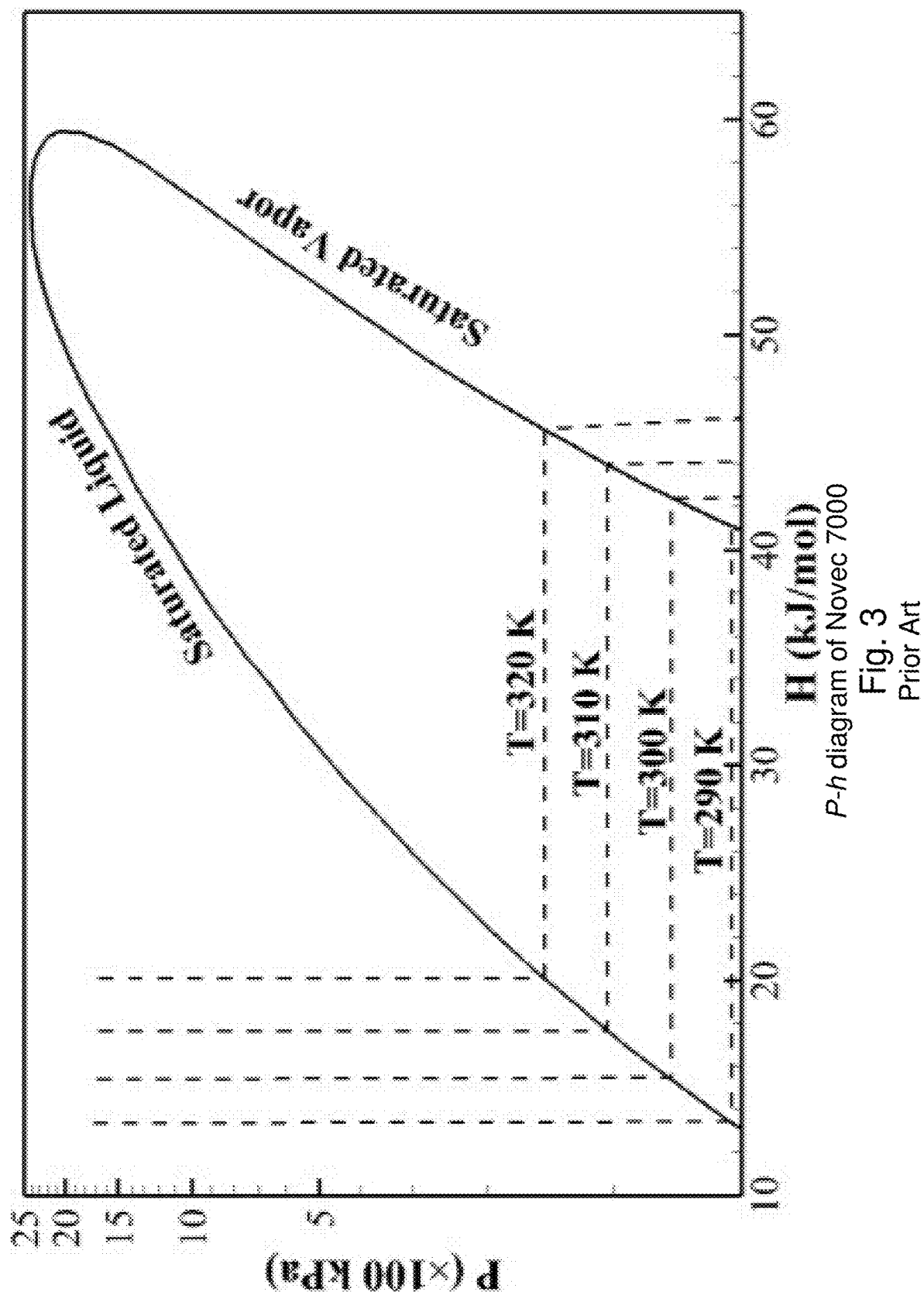
FIG. 3 shows a P-h diagram of Novec 7000 (Extracted from a 3M® datasheet).

FIG. 3 shows a P-h diagram of Novec 7000 (Extracted from a 3M® datasheet).

Figure 4:
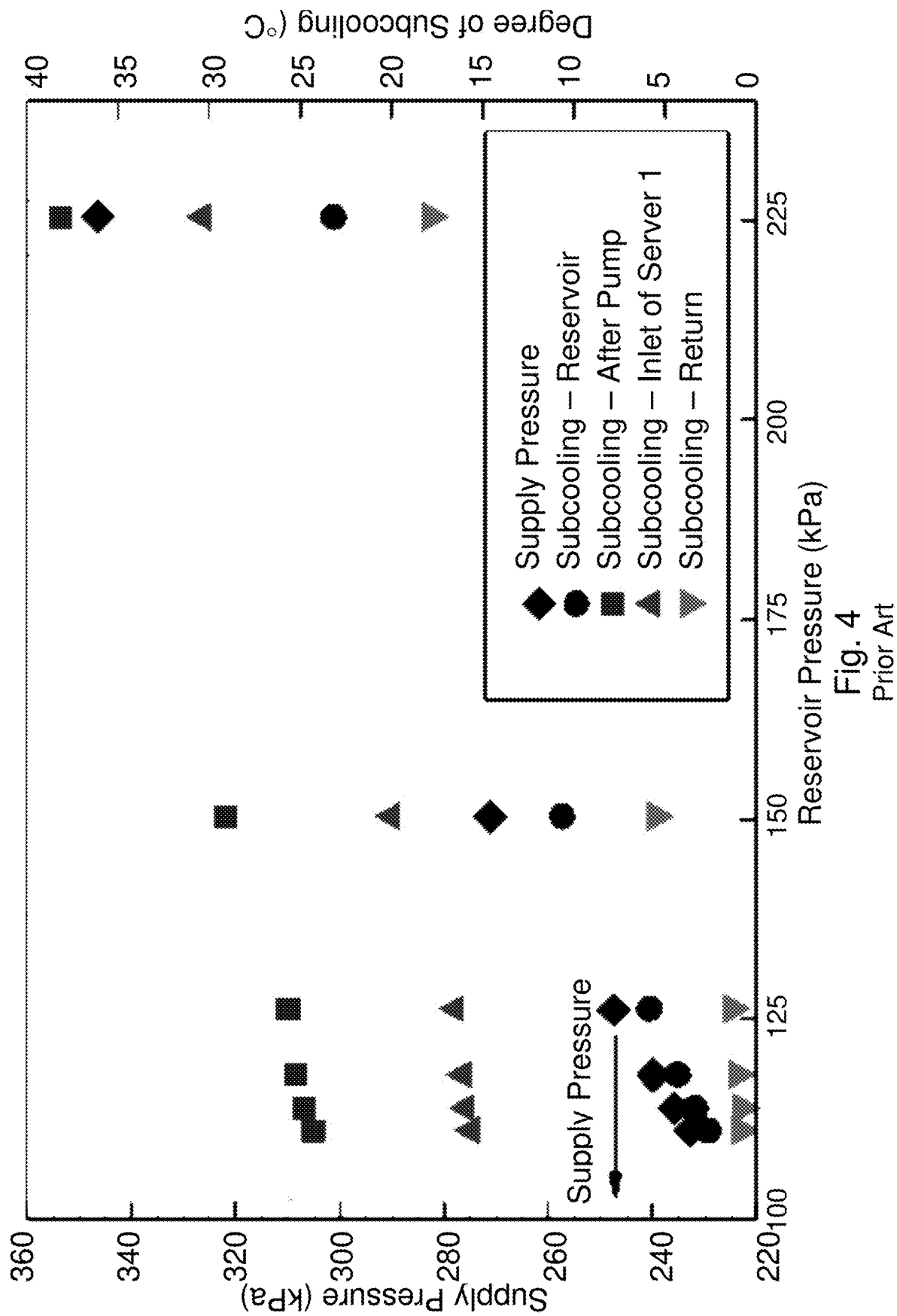
FIG. 4 shows the variation of degree of subcooling in the reservoir and the supply pressure with the reservoir pressure in the embodiment according to FIG. 2.

FIG. 4 shows the variation of degree of subcooling in the reservoir and the supply pressure with the reservoir pressure in the embodiment according to FIG. 2.

One skilled in the art will readily appreciate that the specific methods and results discussed are merely illustrative of the invention as described more fully in the claims which follow thereafter.

REFERENCES

[1] Shehabi, A., Smith, S., Sartor, D., Brown, R., Herrlin, M., Koomey, J., Masanet, E., and Lintner, W., 2016, United States Data Center Energy Usage Report.
[2] Shehabi, A., Smith, S. J., Masanet, E., and Koomey, J., 2018, "Data Center Growth in the United States: Decoupling the Demand for Services from Electricity Use," Environ. Res. Lett., 13(12).
[3] Kadam, S. T., and Kumar, R., 2014, "Twenty First Century Cooling Solution: Microchannel Heat Sinks," Int. J. Therm. Sci., 85, pp. 73-92.
[4] Schmidt, R., 2009, "Packaging of New Servers—Energy Efficiency Aspects," 1st Berkeley Symposium on Energy Efficient Electronics.
[5] Kulkarni, D., Tang, X., Ahuja, S., Dischler, R., and Mahajan, R., 2018, "Experimental Study of Two-Phase Cooling to Enable Large-Scale System Computing Performance," Proc. 17th Intersoc. Conf. Therm. Thermomechanical Phenom. Electron. Syst. ITherm 2018, pp. 596-601.
[6] Hetsroni, G., Mosyak, A., Segal, Z., and Ziskind, G., 2002, "A Uniform Temperature Heat Sink for Cooling of Electronic Devices," Int. J. Heat Mass Transf., 45(16), pp. 3275-3286.
[7] Mudawar, I., and Wadsworth, D. C., 1991, "Critical Heat Flux from a Simulated Chip to a Confined Rectangular Impinging Jet of Dielectric Liquid," Int. J. Heat Mass Transf., 34(6), pp. 465-1479.
[8] Saums, D. L., 2010, "Vaporizable Dielectric Fluid Cooling for IGBT Power Semiconductors," 2010 6th Int. Conf. Integrated Power Electron. Syst., pp. 1-7.
[9] Capozzoli, A., and Primiceri, G., 2015, "Cooling Systems in Data Centers: State of Art and Emerging Technologies," Energy Procedia, 83, pp. 484-493.
[10] Valenzuela, F., Ortega, A., Jones, G., Fleischer, A., Schon, S., and Tipton, R., 2017, "Experiments on the Simultaneous Two-Phase Liquid Cooling of Multiple Simulated Servers at Differing Vertical Rack Positions in Steady State," 16th IEEE Intersoc. Conf. Therm. Thermomechanical Phenom. Electron. Syst. (ITherm) 2017, pp. 871-877.
[11] "3M™ Novec™ 7000 Engineered Fluid" [Online]. Available: multimedia.3 m.com/mws/media/1213720/3m-novec-7000-engineered-fluid-tds.pdf.
[12] Stachecki, T. J., and Ghose, K., 2015, "Short-Term Load Prediction and Energy-Aware Load Balancing for Data Centers Serving Online Requests*," 42nd International Symposium on Computer Architecture (ISCA), Portland, OR, June, pp. 13-17.

[13] Kayahan, E., Eroglu, I., and Koku, H., 2016, "Design of an Outdoor Stacked-Tubular Reactor for Biological Hydrogen Production," Int. J. Hydrogen Energy, 41(42), pp. 19357-19366.

[14] Wang, J., 2011, "Theory of Flow Distribution in Manifolds," Chem. Eng. J., 168(3), pp. 1331-1345.

[15] Gmach, D., Rolia, J., Cherkasova, L., and Kemper, A., 2009, "Resource Pool Management: Reactive versus Proactive or Let's Be Friends," Comput. Networks, 53(17), pp. 2905-2922.

[16] Arlitt, M., and Jin, T., 2000, "A Workload Characterization Study of the 1998 World Cup Web Site," IEEE Netw., 14(3), pp. 30-37.

[17] Gandhi, A., 2013, "Dynamic Server Provisioning for Data Center Power Management," Carnegie Mellon University.

[18] Atikoglu, B., Xu, Y., Frachtenberg, E., Jiang, S., and Paleczny, M., 2012, "Workload Analysis of a Large-Scale Key-Value Store," ACM SIGMETRICS Performance Evaluation Review, ACM, pp. 53-64.

[19] Khalili, Sadegh, Ghazal Mohsenian, Anuroop Desu, Kanad Ghose, and Bahgat Sammakia. "Airflow management using active air dampers in presence of a dynamic workload in data centers." In 2019 35th Semiconductor Thermal Measurement, Modeling and Management Symposium (SEMI-THERM), pp. 101-110. IEEE, 2019.

[20] Khalili, Sadegh, Srikanth Rangarajan, Vadim Gektin, Husam Alissa, and Bahgat Sammakia. "An Experimental Investigation on the Fluid Distribution in a Two-Phase Cooled Rack Under Steady and Transient Information Technology Loads." Journal of Electronic Packaging 142, no. 4 (2020): 041002.

What is claimed is:

1. A phase change refrigerant cooling system, comprising:
    a pump, configured to lift a phase change refrigerant up a height, wherein the phase change refrigerant has a first pressure and a first subcool at the pump, and a second pressure and a second subcool at the height, the first pressure and the first subcool being higher than the second pressure and the second subcool;
    a manifold at the height, comprising:
        an inlet port configured to receive a flow of the phase change refrigerant from the pump comprising a liquid phase and having the second subcool;
        an outlet port configured to output a flow of the phase change refrigerant comprising both a liquid phase and a gas phase, warmed with respect to the received flow of the phase change refrigerant;
        a cold conduit configured to distribute the phase change refrigerant comprising the liquid phase from the inlet port to each of a plurality of cooling loops, each cooling loop being configured to warm the phase change refrigerant with at least one evaporator, such that the phase change refrigerant exiting the cooling loop comprises a liquid phase and a gas phase; and
        a hot conduit configured to receive the warmed phase change refrigerant comprising the liquid phase and the gas phase from the plurality of cooling loops, and convey it to the outlet port;
    a primary heat exchanger, comprising:
        a liquid phase change refrigerant inlet configured to receive a liquid phase change refrigerant having a second subcool from the pump;
        a warm phase change refrigerant outlet configured to supply a mixed liquid phase and gas phase refrigerant to a condenser;
        an inlet port interface configured to supply the flow of the phase change refrigerant comprising the liquid phase having a third subcool to the inlet port, the third subcool being less than the first subcool and the second subcool; and
        an outlet port interface configured to interface with the outlet port, and to receive the flow of the phase change refrigerant comprising a liquid phase and a gas phase,
        wherein the primary heat exchanger transfers heat from the received flow of the phase change refrigerant comprising the liquid phase and the gas phase to the liquid phase change refrigerant having the second subcool, to produce the liquid phase change refrigerant having the third subcool;
    a plurality of secondary heat exchangers, each respective secondary heat exchanger being configured to transfer heat from the warmed phase change refrigerant from a respective cooling loop to a portion of the phase change refrigerant comprising a liquid phase from the cold conduit, whereby a subcooling of the phase change refrigerant comprising a liquid phase entering the respective cooling loop is reduced with respect to the phase change refrigerant comprising a liquid phase;
    a controllable bypass valve, configured to control a bypass flow of a portion of the phase change refrigerant from the inlet port to the outlet port, without the bypass flow passing through the cold conduit or the hot conduit; and
    a control configured to control the controllable bypass valve to control a subcool of the cold conduit at a defined level, to compensate for changes in the second pressure.

2. The phase change refrigerant cooling system according to claim 1, wherein the control comprises a non-electronic control.

3. The phase change refrigerant cooling system according to claim 1, wherein each cooling loop comprises a plurality of evaporators in series, each evaporator being configured to cool a central processing unit of a server in a rack, wherein at least one cooling loop has a different height with respect to the pump.

4. A heat exchanger system for a phase change refrigerant cooled electronic system, comprising:
    an inlet port configured to receive a flow of phase change refrigerant having a first subcool below a boiling point of the phase change refrigerant;
    an outlet port configured to output a flow of heated phase change refrigerant comprising a gas phase;
    an interface cold port configured to supply the phase change refrigerant having a second subcool below the boiling point of the phase change refrigerant to at least one evaporator;
    an interface hot port configured to receive the heated phase change refrigerant comprising a gas phase from the at least one evaporator;
    a first heat exchanger, configured to transfer heat from the heated phase change refrigerant from the at least one evaporator to the liquid phase change refrigerant having the first subcool, to reduce the first subcool and transform the liquid phase change refrigerant having the first subcool to the liquid phase change refrigerant having the second subcool;
    a first valve configured to control a mixing of a portion of the phase change refrigerant having the first subcool below the boiling point of the phase change refrigerant from the inlet port with the heated phase change refrigerant comprising the gas phase from the at least one evaporator, for efflux through the outlet port as the heated phase change refrigerant comprising the gas phase, the mixed portion of the phase change refrigerant bypassing the first heat exchanger;

a second valve configured to control a level of the second subcool;

a pump configured to pressurize the flow of phase change refrigerant having the first subcool to cause a flow up a height gradient from a reservoir to a second heat exchanger, wherein a subcooling of the phase change refrigerant is greater at the reservoir than at the second heat exchanger;

a controller configured to control the second subcool using heat derived from the at least one evaporator through the second heat exchanger;

a manifold configured to:
distribute the heated pumped phase change refrigerant through a cold channel in a manifold to the inlet port,
receive the flow of heated phase change refrigerant comprising a gas phase from the outlet port into a warm channel in the manifold; and
supplying a flow from the warm channel to the second heat exchanger.

5. The heat exchanger system of claim 4, further comprising:
at least one additional heat exchanger, each additional heat exchanger being associated with an additional cold conduit configured to distribute the at least liquid phase change refrigerant from the inlet port to at least two successive evaporators in a respective additional cooling loop, and an additional hot conduit configured to receive the heated phase change refrigerant comprising the liquid phase and the gas phase from the at least two successive evaporators in the additional cooling loop, each additional heat exchanger being configured to transfer heat from the at least two successive evaporators to the at least liquid phase change refrigerant from the inlet port, whereby a subcooling of the at least liquid phase change refrigerant entering the additional cooling loop is reduced.

6. The heat exchanger system of claim 4, further comprising a pump configured to pressurize the subcooled phase change refrigerant to transport it up a height gradient from a reservoir to the heat exchanger, wherein a subcooling of the phase change refrigerant is greater at the reservoir than at the heat exchanger.

7. The heat exchanger system of claim 4, wherein the controller is a non-electronic mechanical controller further configured to maintain the phase change refrigerant entering the heat exchanger at a defined subcooled level.

8. The heat exchanger system of claim 4, wherein the second valve is proximate to the evaporator and is configured to control a flow of the phase change refrigerant based on a temperature difference,
further comprising a second heat exchanger configured to transfer heat from the heated phase change refrigerant comprising the gas phase from the evaporator, to the phase change refrigerant having the second subcool below the boiling point of the phase change refrigerant.

9. The heat exchanger system of claim 4, wherein the interface cold port is configured to supply the phase change refrigerant having a second subcool below the boiling point of the phase change refrigerant to a series of at least two successive evaporators in series in a cooling loop.

10. The heat exchanger system of claim 4, further comprising an automated controller configured to adjust the first valve to control the first subcool.

11. A method for cooling an information technology system, comprising:
receiving a flow of at least a subcooled liquid phase change refrigerant through an inlet port and returning a warmed flow through an outlet port;
cooling the information technology system by heat transfer in a plurality of evaporators in series, each respective evaporator being configured to produce a warmed at least gaseous phase change refrigerant from a received portion of the flow of at least the pumped subcooled liquid phase change refrigerant;
exchanging heat from the warmed at least gaseous phase change refrigerant from the plurality of evaporators in series to the received flow of that at least a subcooled liquid phase change refrigerant with at least one first heat exchanger;
bypassing the at least one first heat exchanger with a portion of a flow of phase change refrigerant from the inlet port to the outlet port to form a mixture of the warmed at least gaseous phase change refrigerant with the at least the subcooled liquid phase change refrigerant using a first controllable bypass valve controlled to maintain a defined a subcool level of the mixture of the warmed at least gaseous phase change refrigerant with the at least the subcooled liquid phase change refrigerant;
pumping the subcooled liquid phase change refrigerant up a height gradient from a reservoir to a second heat exchanger, wherein a subcooling of the phase change refrigerant is greater at the reservoir than at the second heat exchanger;
heating the pumped subcooled phase change refrigerant with heat from the warmed at least gaseous phase change refrigerant in the second heat exchanger;
distributing the heated pumped phase change refrigerant through a cold channel in a manifold to the inlet port;
receiving the warmed at least gaseous phase change refrigerant from the outlet port into a warm channel in the manifold; and
supplying the collected warmed at least gaseous phase change refrigerant from the warm channel in the manifold to the second heat exchanger; and
controlling a thermodynamic characteristic of the received flow of the at least a subcooled liquid phase change refrigerant with a second valve, comprising controlling a subcool of the received portion of the flow of at least subcooled liquid phase change refrigerant entering the plurality of evaporators in series with a control using heat derived from the plurality of evaporators in series.

12. The method of claim 11, wherein the heat is exchanged from the warmed at least gaseous phase change refrigerant from the evaporator to the subcooled phase change refrigerant with the first heat exchanger having a cold plate.

13. The method of claim 11, further comprising providing at least two sets of the plurality of evaporators in series, and normalizing an amount of subcooling of the at least subcooled liquid phase change refrigerant entering each of the sets of the plurality of evaporators in series dependent on a relative height.

14. The phase change refrigerant cooling system according to claim 1, wherein the pump is further configured to lift the phase change refrigerant up a second height, wherein the phase change refrigerant has a third pressure and a fourth subcool at the second height, the second height being different from the first height, the first pressure and the first subcool being higher than the third pressure and the fourth subcool;

a second manifold at the second height, comprising:
  a second inlet port configured to receive a flow of the phase change refrigerant from the pump comprising a liquid phase and having the fourth subcool;
  a second outlet port configured to output a flow of the phase change refrigerant comprising both a liquid phase and a gas phase, warmed with respect to the received flow of the phase change refrigerant;
  a second cold conduit configured to distribute the phase change refrigerant comprising the liquid phase from the second inlet port to each of a plurality of second cooling loops, each second cooling loop being configured to warm the phase change refrigerant with at least one second evaporator, such that the phase change refrigerant exiting each second cooling loop comprises a liquid phase and a gas phase; and
  a second hot conduit configured to receive the warmed phase change refrigerant comprising the liquid phase and the gas phase from the plurality of second cooling loops, and convey it to the second outlet port;

a second primary heat exchanger, comprising:
  a second liquid phase change refrigerant inlet configured to receive a liquid phase change refrigerant having the fourth subcool from a pump;
  a second warm phase change refrigerant outlet configured to supply a mixed liquid phase and gas phase refrigerant to a second condenser;
  a second inlet port interface configured to supply the flow of the phase change refrigerant comprising the liquid phase having a fifth subcool to the inlet port; and
  a second outlet port interface configured to interface with the second outlet port, and to receive the flow of the phase change refrigerant comprising a liquid phase and a gas phase, wherein the second primary heat exchanger transfers heat from the received flow of the phase change refrigerant comprising the liquid phase and the gas phase to the liquid phase change refrigerant having the fourth subcool, to produce the liquid phase change refrigerant having the fifth subcool;

a plurality of second secondary heat exchangers, each respective second secondary heat exchanger being configured to transfer heat from the warmed phase change refrigerant from a respective second cooling loop to a portion of the phase change refrigerant comprising a liquid phase from the second cold conduit, whereby a subcooling of the phase change refrigerant comprising a liquid phase entering the respective second cooling loop is reduced with respect to the phase change refrigerant comprising a liquid phase;

a second controllable bypass valve, configured to control a second bypass flow of a portion of the phase change refrigerant from the second inlet port to the second outlet port, without the bypass flow passing through the second cold conduit or the second hot conduit; and a second control configured to control the second controllable bypass valve to control a subcool of the second cold conduit at a second defined level, to compensate for at least changes in the third pressure.

15. The method of claim 11, wherein said controlling comprises controlling the heat exchanging to maintain the phase change refrigerant at a predetermined subcooled level.

16. The method of claim 11, wherein said controlling comprises non-electronically controlling a flow of the phase change refrigerant with the second valve proximate to the plurality of evaporators in series operated as a mechanical regulator based on at least a temperature difference.

17. The method of claim 11, wherein said controlling comprises controlling the exchanging of heat from the warmed at least gaseous phase change refrigerant from the evaporator to the subcooled phase change refrigerant dependent on a to maintain the defined subcool level of the mixture of the warmed at least gaseous phase change refrigerant with the at least the subcooled liquid phase change refrigerant entering the evaporator.

18. The method of claim 11, wherein said controlling comprises controlling the exchanging of heat from the warmed at least gaseous refrigerant from the evaporator to the subcooled phase change refrigerant dependent on sensing a cavitation of refrigerant.

19. The method of claim 11, wherein said controlling comprises controlling the exchanging of heat from the warmed at least gaseous refrigerant from the evaporator to the subcooled phase change refrigerant to maintain at least a portion of liquid refrigerant in the at least gaseous refrigerant, wherein a terminal evaporator of the plurality of evaporators in series receives a flow of phase change refrigerant comprising a liquid phase and a gas phase.

20. The method according to claim 11, wherein the information technology system has a plurality of cooling loops, each cooling loop comprising a respective plurality of evaporators in series, the plurality of cooling loops having different heights with respect to a common pump, each cooling loop being fed by a different respective first heat exchanger, further comprising separately controlling a subcool of the received portion of the flow of at least subcooled liquid phase change refrigerant from each respective heat exchanger.

* * * * *